(12) United States Patent
Lee et al.

(10) Patent No.: US 11,690,280 B2
(45) Date of Patent: *Jun. 27, 2023

(54) DISPLAY DEVICE AND SUPPORT FILM STRUCTURE FOR DISPLAY DEVICE

(71) Applicant: Samsung Display Co., Ltd., Yongin-si (KR)

(72) Inventors: Chang Han Lee, Cheonan-si (KR); Myung Hwan Kim, Yongin-si (KR); Sang Yeol Kim, Hwaseong-si (KR); Woo Hyun Kim, Hwaseong-si (KR); Hyo Jin Kim, Suwon-si (KR); Kyoung Il Min, Hwaseong-si (KR); Tae Hyun Sung, Seoul (KR); Se Joong Shin, Cheonan-si (KR); Ho Ryun Chung, Suwon-si (KR); Jae cheol Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/392,093

(22) Filed: Aug. 2, 2021

(65) Prior Publication Data

US 2021/0367173 A1 Nov. 25, 2021

Related U.S. Application Data

(63) Continuation of application No. 16/364,181, filed on Mar. 26, 2019, now Pat. No. 11,081,660.

(30) Foreign Application Priority Data

May 3, 2018 (KR) .................. 10-2018-0051059
Mar. 12, 2019 (KR) .................. 10-2019-0027870

(51) Int. Cl.
*H01L 51/00* (2006.01)
*B32B 7/022* (2019.01)
(Continued)

(52) U.S. Cl.
CPC .............. *H10K 77/111* (2023.02); *B32B 3/30* (2013.01); *B32B 7/022* (2019.01); *B32B 27/08* (2013.01);
(Continued)

(58) Field of Classification Search
CPC ................ H05K 1/147; H05K 1/0281; H05K 2201/055; H05K 2201/0281;
(Continued)

(56) References Cited

U.S. PATENT DOCUMENTS 9,274,559 B2 3/2016 Prushinskiy et al.
9,460,644 B2 * 10/2016 Namkung ......... G02F 1/133305
(Continued)

FOREIGN PATENT DOCUMENTS

EP 3318953 5/2018
EP 3525035 8/2019
(Continued)

OTHER PUBLICATIONS

Extended European Search Report dated Sep. 6, 2019, in European Patent Application No. 19172432.7.
(Continued)

*Primary Examiner* — Victoria K. Hall
(74) *Attorney, Agent, or Firm* — H.C. Park & Associates, PLC

(57) ABSTRACT

A display device includes a display panel, a support film, and a polymer layer. The display panel includes a display area comprising a first area that is bendable, and a non-display area adjacent to the display area. The support film is coupled to a bottom surface of the display panel. The support film
(Continued)

includes a first groove overlapping with the first area. The polymer layer is disposed in the first groove. The polymer layer includes a material with higher flexibility than the support film. Angles formed by the top surface of the support film and inner sides of the support film defining the first groove are acute angles.

22 Claims, 33 Drawing Sheets

(51) Int. Cl.
| | |
|---|---|
| B32B 3/30 | (2006.01) |
| B32B 27/08 | (2006.01) |
| B32B 27/28 | (2006.01) |
| B32B 27/36 | (2006.01) |
| H01L 27/32 | (2006.01) |
| H01L 51/52 | (2006.01) |
| H05K 1/02 | (2006.01) |
| H05K 1/14 | (2006.01) |
| G06F 1/16 | (2006.01) |
| H10K 77/10 | (2023.01) |
| H04M 1/02 | (2006.01) |
| H10K 50/844 | (2023.01) |
| H10K 59/131 | (2023.01) |
| H10K 102/00 | (2023.01) |

(52) U.S. Cl.
CPC ............ *B32B 27/281* (2013.01); *B32B 27/36* (2013.01); *G06F 1/1652* (2013.01); *H04M 1/0268* (2013.01); *H05K 1/0281* (2013.01); *H05K 1/147* (2013.01); *H10K 50/844* (2023.02); *H10K 59/131* (2023.02); *B32B 2457/206* (2013.01); *H05K 2201/055* (2013.01); *H05K 2201/10128* (2013.01); *H10K 2102/311* (2023.02)

(58) Field of Classification Search
CPC .............. G06F 1/1652; H01L 51/0097; H01L 51/5253; H01L 27/3276; H01L 27/3244; H01L 27/32; H01L 2251/5338; B32B 7/022; B32B 3/30; B32B 27/08; B32B 27/281; B32B 27/36; B32B 2457/206
USPC .......................................................... 257/40
See application file for complete search history.

(56) References Cited

U.S. PATENT DOCUMENTS

| | | | |
|---|---|---|---|
| 9,485,858 B2 | 11/2016 | Namkung et al. | |
| 9,655,235 B2 | 5/2017 | Hwang et al. | |
| 9,811,119 B2 | 11/2017 | Seo | |
| 9,811,120 B2 | 11/2017 | Namkung et al. | |
| 9,823,699 B2 | 11/2017 | Ko et al. | |
| 10,020,462 B1* | 7/2018 | Ai | H01L 51/524 |
| 10,056,568 B2* | 8/2018 | Min | H01L 51/5237 |
| 10,062,362 B2 | 8/2018 | Kwak et al. | |
| 10,109,704 B2* | 10/2018 | Shin | H01L 51/5253 |
| 10,141,540 B2 | 11/2018 | Sung et al. | |
| 10,212,811 B1 | 2/2019 | Zhang et al. | |
| 10,224,498 B2 | 3/2019 | Um et al. | |
| 10,340,477 B2 | 7/2019 | Kwon et al. | |
| 10,355,241 B2* | 7/2019 | Ahn | H01L 51/0097 |
| 10,270,059 B2 | 8/2019 | Kim | |
| 10,375,839 B2 | 8/2019 | Jung et al. | |
| 10,411,219 B2* | 9/2019 | Sung | H01L 51/0097 |
| 10,439,017 B2 | 10/2019 | Kim et al. | |
| 10,483,098 B2 | 11/2019 | Um et al. | |
| 10,553,802 B2* | 2/2020 | Min | H01L 51/5281 |
| 10,615,366 B2 | 4/2020 | Han et al. | |
| 10,621,909 B2 | 4/2020 | Kwon et al. | |
| 10,877,328 B2* | 12/2020 | Hiramoto | G02F 1/1345 |
| 10,901,461 B2 | 1/2021 | Wu et al. | |
| 10,908,716 B2 | 2/2021 | Ryu | |
| 10,921,857 B2 | 2/2021 | Kim et al. | |
| 10,936,012 B2 | 3/2021 | Kim | |
| 11,031,565 B2* | 6/2021 | Min | H01L 51/0001 |
| 11,081,660 B2* | 8/2021 | Lee | B32B 7/022 |
| 11,084,250 B2* | 8/2021 | Jung | G02F 1/133305 |
| 11,145,838 B2* | 10/2021 | Jeong | H01L 51/56 |
| 11,362,305 B2* | 6/2022 | Sung | H01L 27/3246 |
| 11,586,247 B2* | 2/2023 | Ryu | G06F 1/1652 |
| 2006/0173087 A1 | 8/2006 | Hyde et al. | |
| 2013/0148312 A1 | 6/2013 | Han et al. | |
| 2013/0169515 A1* | 7/2013 | Prushinskiy | H01L 51/5253 345/55 |
| 2014/0226275 A1 | 8/2014 | Ko et al. | |
| 2015/0002398 A1 | 1/2015 | Nakhimov | |
| 2015/0043174 A1* | 2/2015 | Han | G02F 1/13452 428/156 |
| 2015/0055287 A1 | 2/2015 | Seo | |
| 2015/0146386 A1 | 5/2015 | Namkung et al. | |
| 2015/0200375 A1 | 7/2015 | Kim et al. | |
| 2015/0255522 A1 | 9/2015 | Sato et al. | |
| 2015/0313004 A1 | 10/2015 | Namkung et al. | |
| 2015/0357387 A1 | 12/2015 | Lee et al. | |
| 2015/0370287 A1 | 12/2015 | Ko et al. | |
| 2016/0085268 A1 | 3/2016 | Aurongzeb et al. | |
| 2016/0101610 A1* | 4/2016 | Namkung | B29C 61/065 156/196 |
| 2017/0023986 A1 | 1/2017 | Xin et al. | |
| 2017/0045914 A1* | 2/2017 | Namkung | H05K 1/028 |
| 2017/0062760 A1 | 3/2017 | Kim | |
| 2017/0064845 A1 | 3/2017 | Jung et al. | |
| 2017/0092224 A1 | 3/2017 | Senda et al. | |
| 2017/0092884 A1 | 3/2017 | Zhang et al. | |
| 2017/0263887 A1* | 9/2017 | Han | H01L 27/3276 |
| 2017/0285844 A1 | 10/2017 | Park et al. | |
| 2017/0338294 A1 | 11/2017 | Choi et al. | |
| 2017/0357289 A1 | 12/2017 | Ahn | |
| 2017/0358772 A1* | 12/2017 | Sung | H01L 51/0097 |
| 2017/0364029 A1 | 12/2017 | Cho et al. | |
| 2018/0035208 A1 | 2/2018 | Choi et al. | |
| 2018/0047938 A1* | 2/2018 | Kishimoto | H01L 27/3244 |
| 2018/0090702 A1* | 3/2018 | Um | H01L 51/0097 |
| 2018/0143353 A1 | 5/2018 | Kim et al. | |
| 2018/0175323 A1* | 6/2018 | Ahn | H01L 51/5253 |
| 2018/0217639 A1 | 8/2018 | Jones et al. | |
| 2018/0348821 A1 | 12/2018 | Hamburgen et al. | |
| 2018/0356859 A1 | 12/2018 | Hamburgen et al. | |
| 2019/0107866 A1 | 4/2019 | Han et al. | |
| 2019/0132947 A1 | 5/2019 | Koo et al. | |
| 2019/0204867 A1 | 7/2019 | Song et al. | |
| 2019/0204879 A1 | 7/2019 | Park et al. | |
| 2019/0248102 A1 | 8/2019 | Song et al. | |
| 2019/0334114 A1 | 10/2019 | Park | |
| 2019/0361494 A1 | 11/2019 | Wu et al. | |
| 2020/0029449 A1 | 1/2020 | Makinen et al. | |
| 2020/0051881 A1 | 2/2020 | Park et al. | |
| 2020/0057545 A1 | 2/2020 | Seomoon et al. | |
| 2020/0073495 A1 | 3/2020 | Bok et al. | |
| 2020/0084897 A1 | 3/2020 | Shin et al. | |
| 2020/0089274 A1 | 3/2020 | Kim | |
| 2020/0161384 A1 | 5/2020 | Wang et al. | |
| 2020/0166970 A1 | 5/2020 | Yeom | |
| 2020/0171784 A1 | 6/2020 | Hamburgen | |
| 2020/0380893 A1 | 12/2020 | Park et al. | |
| 2021/0004048 A1 | 1/2021 | Ha et al. | |
| 2021/0013294 A1 | 1/2021 | Moon et al. | |
| 2021/0028252 A1 | 1/2021 | Hong et al. | |
| 2021/0057500 A1 | 2/2021 | Saitoh et al. | |
| 2021/0335840 A1* | 10/2021 | Qin | H01L 27/1244 |

FOREIGN PATENT DOCUMENTS

| KR | 1020170110221 | 10/2017 |
|---|---|---|
| KR | 1020170127392 | 11/2017 |
| KR | 1020170132382 | 12/2017 |
| KR | 1020170140490 | 12/2017 |

(56) References Cited

FOREIGN PATENT DOCUMENTS

| | | |
|---|---|---|
| KR | 1020170141851 | 12/2017 |
| KR | 1020180000039 | 1/2018 |
| TW | 201405287 | 2/2014 |
| WO | 2017052732 | 3/2017 |

OTHER PUBLICATIONS

Non-Final Office Action dated Jun. 16, 2020, in U.S. Appl. No. 16/364,181.
Non-Final Office Action dated Dec. 16, 2020, in U.S. Appl. No. 16/364,181.
Notice of Allowance dated Apr. 2, 2021, in U.S. Appl. No. 16/364,181.
Machine Translation, Han, Korean Pat. Pub. No. KR 10-2017-0127392, Translation Date: Aug. 20, 2020, Espacenet, All Pages (Year: 2020).

\* cited by examiner

300 : 310, 330, 350
FS : 300, 500

DISPLAY DEVICE AND SUPPORT FILM STRUCTURE FOR DISPLAY DEVICE

CROSS-REFERENCE TO RELATED APPLICATIONS

This application is a Continuation of U.S. patent application Ser. No. 16/364,181, filed Mar. 26, 2019, which issued as U.S. Pat. No. 11,081,660, which claims priority to and the benefit of Korean Patent Application No. 10-2018-0051059, filed May 3, 2018, and Korean Patent Application No. 10-2019-0027870, filed Mar. 12, 2019, each of which is hereby incorporated by reference for all purposes as if fully set forth herein.

BACKGROUND

Field

Exemplary embodiments generally relate to a display device and a support film structure for a display device.

Discussion

Display devices are devices capable of displaying image signals. Examples of display devices include nearly all types of devices displaying image signals input from, for instance, an external source, such as a television (TV), a computer monitor, a personal digital assistant (PDA), a smart device, etc. High-quality flat panel display modules, such as an organic light-emitting diode (OLED) display panel, a liquid crystal display (LCD) panel, a plasma display panel (PDP), an electrophoretic display panel, and the like, may be used in display devices. Flexible display devices that are bendable, foldable, rollable, etc., can be fabricated as thin, light-weight display devices, and can improve portability. Flexible display devices can be realized using flexible substrates formed of, for example, a plastic material. The plastic material may be utilized instead of glass substrates.

The above information disclosed in this section is only for understanding the background of the inventive concepts, and, therefore, may contain information that does not form prior art.

SUMMARY

Some exemplary embodiments are capable of providing a bendable or foldable display device.

Some exemplary embodiments provide a support film structure for a display device. The support film structure is capable of being applied to a bendable or foldable display device.

Additional aspects will be set forth in the detailed description which follows, and, in part, will be apparent from the disclosure, or may be learned by practice of the inventive concepts.

According to some exemplary embodiments, a display device includes a display panel, a support film, and a polymer layer. The display panel includes a display area comprising a first area that is bendable, and a non-display area adjacent to the display area. The support film is coupled to a bottom surface of the display panel. The support film includes a first groove overlapping with the first area. The polymer layer is disposed in the first groove. The polymer layer includes a material with higher flexibility than the support film. Angles formed by the top surface of the support film and inner sides of the support film defining the first groove are acute angles.

According to some exemplary embodiments, a display device includes a first area that extends in a first direction, the first area being bendable; and a non-display area adjacent to the display area. The polymer layer is disposed below the display panel, is coupled to the display panel, and overlaps with the first area. The support film is disposed below the display panel and is coupled to the display panel. The support film includes first and second film portions that are spaced apart from each other in a second direction with the polymer layer interposed therebetween. The second direction intersects the first direction. A width, in the second direction, of the polymer layer gradually increases with increasing distance from the display panel along a thickness direction crossing the first and second directions.

According to some exemplary embodiments, a support film structure for a display device includes a support film and a polymer layer. The support film includes a first groove extending in a first direction, and a second groove extending in the first direction and spaced apart from the first groove in a second direction crossing the first direction. The polymer layer is disposed in the first groove. The polymer layer includes a material with higher flexibility than the support film. The polymer layer includes a portion having a variable width along a thickness direction crossing the first and second directions.

Other features and exemplary embodiments may be apparent from the following detailed description, the drawings, and the claims.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
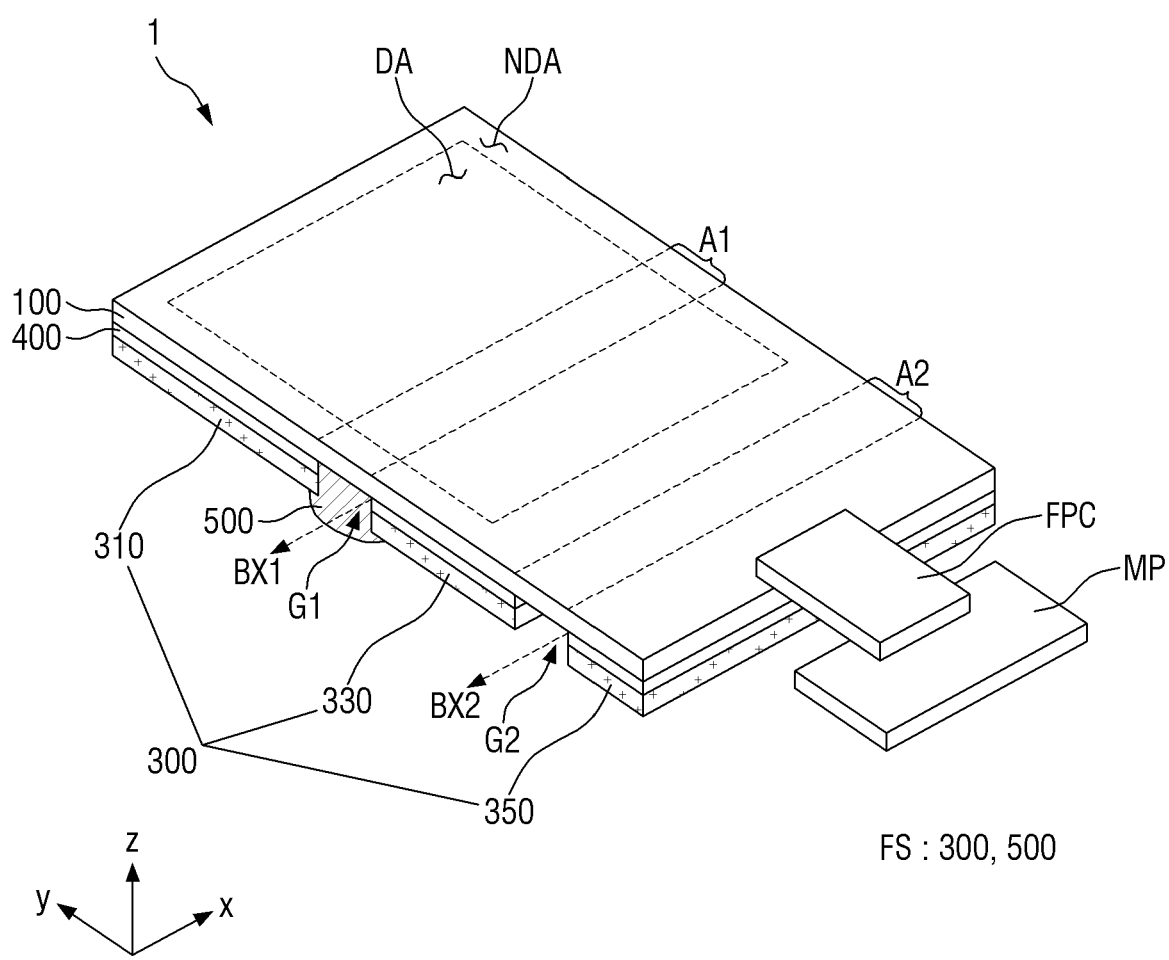
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Exemplary embodiments will, hereinafter, be described with reference to the accompanying drawings.

Figure 2:
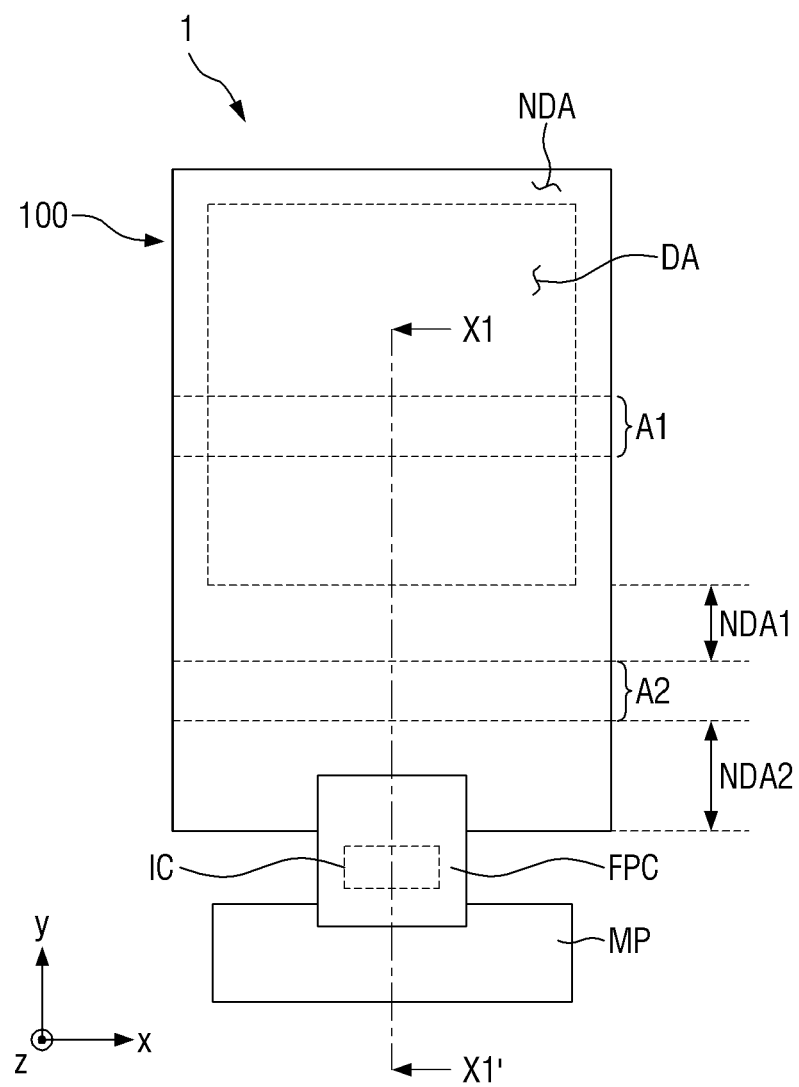
FIG. 2 is a plan view of the display device of FIG. 1 according to some exemplary embodiments.
Figure 3:
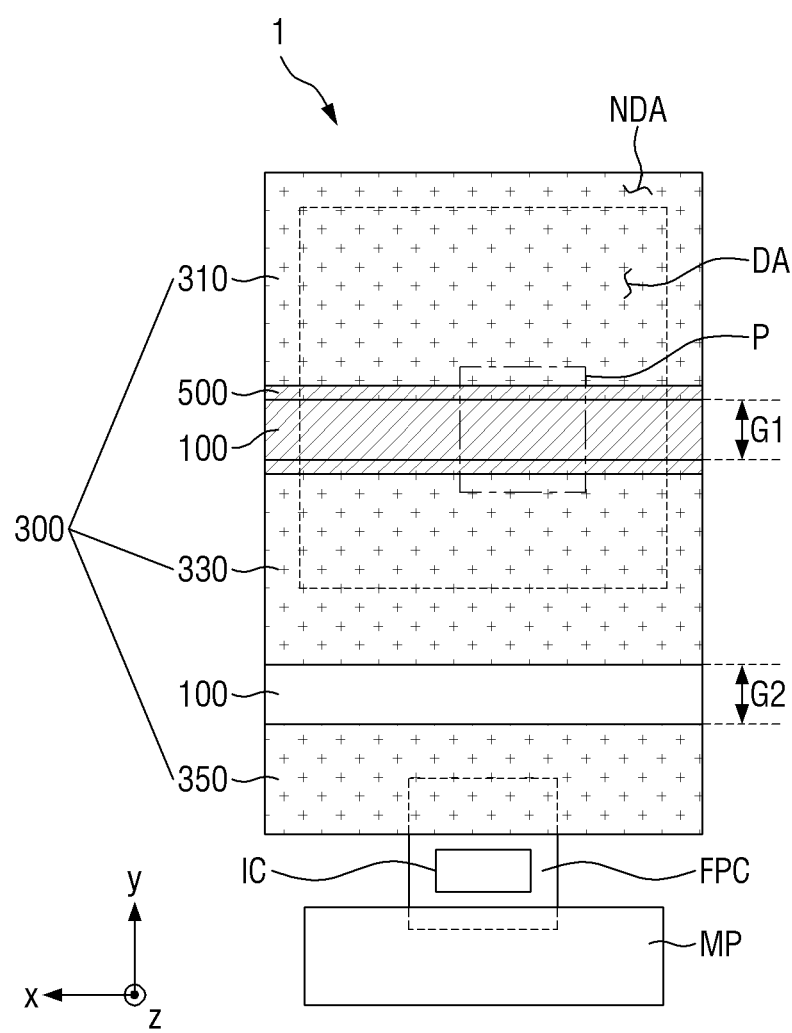
FIG. 3 is a rear view of the display device of FIG. 1 according to some exemplary embodiments.
Figure 4:
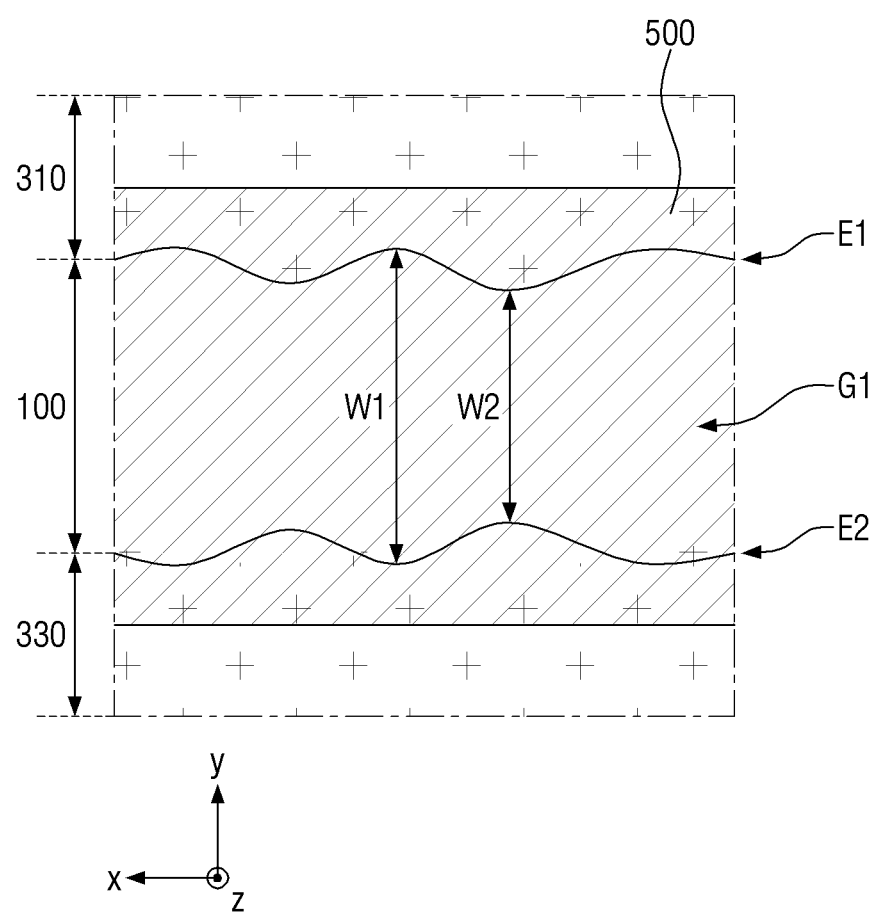
FIG. 4 is an enlarged rear view of a portion P of FIG. 3 according to some exemplary embodiments.

FIG. 1 is a perspective view of a display device according to some exemplary embodiments. FIG. 2 is a plan view of the display device of FIG. 1 according to some exemplary embodiments. FIG. 3 is a rear view of the display device of FIG. 1 according to some exemplary embodiments. It is noted that the rear view of FIG. 3 depicts the display device in a state prior to being bent or folded. FIG. 4 is an enlarged rear view of a portion P of FIG. 3 according to some exemplary embodiments.

Referring to FIGS. 1 through 4, a display device 1 may be applied to, for example, a mobile terminal. Examples of the mobile terminal include a tablet personal computer (PC), a smartphone, a personal digital assistant (PDA), a portable multimedia player (PMP), a game console, a wristwatch-type electronic device, and the like. However, the type of the mobile terminal to which the display device 1 is applicable is not particularly limited. In some exemplary embodiments, the display device 1 may be used not only in a large-size electronic device, such as a television (TV), an external billboard, etc., but also in a mid- or small-size electronic device, such as a PC, a notebook computer, a car navigation device, a camera, etc.

The display device 1 may have a rectangular shape in a plan view. The display device 1 may have two short sides extending in a first direction X and two long sides extending in a second direction Y. The corners where the two long sides and the two short sides of the display device 1 meet may be at a right angle or may be curved. The planar shape of the display device 1 is not particular limited, and the display device 1 may have a circular shape or another shape in a plan view.

The display device 1 may include a display panel 100, a support film 300, and a polymer layer 500. The display device 1 may further include a resin layer 400.

The display panel 100 may have a display area DA in which images are displayed and a non-display area NDA in which no images are displayed. In some exemplary embodiments, the non-display area NDA may be disposed adjacent to the display area DA, e.g., outside the display area DA.

The display panel 100 may have first and second areas A1 and A2 in which the display panel 100 is bendable or foldable.

In a plan view, the first area A1 may extend across the display area DA along the first direction X. The display panel 100 can be folded or bent along a first bending axis BX1, which extends in the first area A1 along the first direction X. The first area A1 may include a part of the display area DA and a part of the non-display area NDA.

Similarly, the second area A2 may extend across the non-display area NDA along the first direction X. In some exemplary embodiments, the second area A2 may be disposed in a part of the non-display area NDA adjacent to the display area DA, such as adjacent to the display area DA in the second direction Y. That is, the second area A2 may be located in the non-display area NDA, e.g., between the display area DA and a part of the non-display area NDA to which a flexible printed circuit board (PCB) FPC is connected.

The second area A2 may be a part of the non-display area NDA and may be spaced apart from the display area DA. Referring to FIG. 2, a part of the non-display area NDA disposed below the display area DA may include a first non-display area NDA1, which is adjacent to the display area DA, and a second non-display area NDA2, which is more distant than the first non-display area NDA1 from the display area DA and to which the flexible PCB FPC is connected. The second area A2 may be located between the first and second non-display areas NDA1 and NDA2. The display panel 100 can be bent along a second bending axis BX2, which extends in the second area A2 along the first direction X.

In some exemplary embodiments, the display panel 100 may be a display panel including emissive elements. For example, the display panel 100 may include organic light-emitting diodes (OLEDs), quantum dot light-emitting diodes (LEDs), and/or inorganic material-based micro-LEDs. For convenience, it is assumed that the display panel 100 includes OLEDs, and the elements of the display panel 100 will be described later in further detail.

Unless specified otherwise, the terms "upper," "top," "top surface," and "upward," as used herein, refer to a display side of the display panel 100, i.e., the side of the display panel 100 in a Z-axis direction, and the terms "lower," "bottom," "bottom surface," and "downward," as used herein, refer to the opposite side of the display panel 100 to the display side, i.e., the side of the display panel 100 in the opposite direction of the Z-axis direction.

The support film 300 may be disposed below the display panel 100. In some exemplary embodiments, the support film 300 may be coupled to the bottom surface of the display panel 100. The support film 300 may support the display panel 100, which is flexible, and may protect the bottom surface of the display panel 100.

In some exemplary embodiments, the support film 300 may be formed of a more rigid material than a polymer layer 500 that will be described later. In some exemplary embodiments, the support film 300 may include at least one of polyethylene terephthalate (PET), polycarbonate (PC), and polymethyl methacrylate (PMMA). For example, the support film 300 may include PET.

First and second grooves G1 and G2 may be defined in the support film 300.

The first groove G1 may be formed to overlap with the first area A1 of the display panel 100 and may extend along the first direction X. Since the first groove G1 is defined in the support film 300 to overlap with the first area A1, the display panel 100 can be bent or folded in the first area A1. Also, since the first area A1 includes a part of the display area DA, the display device 1 can be implemented as a foldable display device.

The second groove G2 may be formed to overlap with the second area A2 of the display panel 100 and may extend along the first direction X. Since the second groove G2 is defined in the support film 300 to overlap with the second area A2, the display panel 100 can be bent in the second area A2. The entire second area A2 is included in the non-display area DA. That is, the display panel 100 can be bent in a downward direction in a part of the non-display area NDA. Accordingly, the non-display area NDA as viewed from above the display device 1 can be reduced, and the bezel width of the display device 1 can also be reduced.

The support film 300 may include first and second film portions 310 and 330, which are separated by the first groove G1, and a third film portion 350, which is separated from the second film portion 330 by the second groove G2.

The first and second film portions 310 and 330 may overlap with the display area DA of the display panel 100 and may partially overlap with the non-display area NDA of the display panel 100. For instance, the second film portion 330 may overlap with the first non-display area NDA1 of the non-display area NDA. The third film portion 350 may overlap with the non-display area NDA of the display panel 100, but not with the display area DA.

The resin layer 400 may be disposed between the support film 300 and the display panel 100. The resin layer 400 may couple the display panel 100 and the support film 300 together. That is, the support film 300 may be coupled to the display panel 100 via the resin layer 400.

The first and second grooves G1 and G2 may be further defined in the resin layer 400. Accordingly, a portion of the bottom surface of the display panel 100 may be exposed through the first and second grooves G1 and G2.

In some exemplary embodiments, the resin layer 400 may including at least one of a urethane resin, an acrylic resin, and a silicone resin. For example, the resin layer 400 may be formed of an acrylic resin.

The first and second grooves G1 and G2 may be formed by laser processing. Thus, in some exemplary embodiments, such as illustrated in FIG. 4, the distance between first and second edges E1 and E2 of the first groove G1 may not be uniform. For example, the first and second edges E1 and E2 of the first groove G1 may not necessarily fall on straight lines extending along the first direction X, but may be partially curved when viewed from the back of the display panel 100. Accordingly, the width, in the second direction Y, of a part of the bottom surface of the display panel 100 exposed through the first groove G1 may not be uniform. For example, the bottom surface of the display panel 100 may include a portion having a first width W1 in the second direction Y and a portion having a second width W2 in the second direction Y. The second width W2 is different from the first width W1.

Although not specifically illustrated, the distance between the edges of the second groove G2, like the first and second edges E1 and E2 of the first groove G1, may not be uniform.

The polymer layer 500 may be disposed in the first groove G1, which is defined in the support film 300 and the resin layer 400. The polymer layer 500 may be formed of a more flexible material than the support film 300. In some exemplary embodiments, the polymer layer 500 may include at least one of polyethylene naphthalate (PEN), polyimide (PI), polyethylene sulfide (PES), polyamide (PA), and aramid. For example, the support film 300 may include PET, and the polymer layer 500 may include PI.

In a case where the display panel 100 is repeatedly bent or folded in the first area A1, the first and second film portions 310 and 330 of the support film 300 may be peeled off of the display panel 100, and the display panel 100 may remain bent because of being short (or lacking) of a restoring force. However, since the polymer layer 500 exists in the first groove G1, the support film 300 can be prevented from being peeled off of the display panel 100 when the display panel 100 is repeatedly bent or folded. Also, since the polymer layer 500 can provide a restoring force to the display panel 100, reliability of the display device 1 can be improved.

The flexible PCB FPC may be connected to the display panel 100. In some exemplary embodiments, the flexible PCB FPC may be connected to the non-display area NDA of the display panel 100, e.g., may be connected to the second non-display area NDA2.

In some exemplary embodiments, a driver integrated chip (or circuit) IC may be mounted on the flexible PCB FPC. The driver integrated chip IC provides driving signals to the display panel 100. In some exemplary embodiments, driver integrated chip IC may include at least one of a data driver applying data signals to data lines, a gate driver applying gate signals to gate lines, and a signal controller controlling operations of the data driver and the gate driver. In some exemplary embodiments, the driver integrated chip IC may be mounted on the flexible PCB FPC in a chip-on-film (COF) fashion. In some exemplary embodiments, the driver integrated chip IC may be mounted in the non-display area NDA of the display panel 100. The flexible PCB FPC may be implemented as a flexible wiring board.

A main PCB MP may be electrically connected to the display panel 100 via the flexible PCB FPC and may transmit signals to, or receive signals from, the driver integrated chip IC. The main PCB MP may provide image data, control signals, and a power supply voltage to the display panel 100 or the flexible PCB FPC. The main PCB MP may include active elements and passive elements.

The display device 1 will hereinafter be described in more detail with reference to FIGS. 5 through 10.

Figure 5:
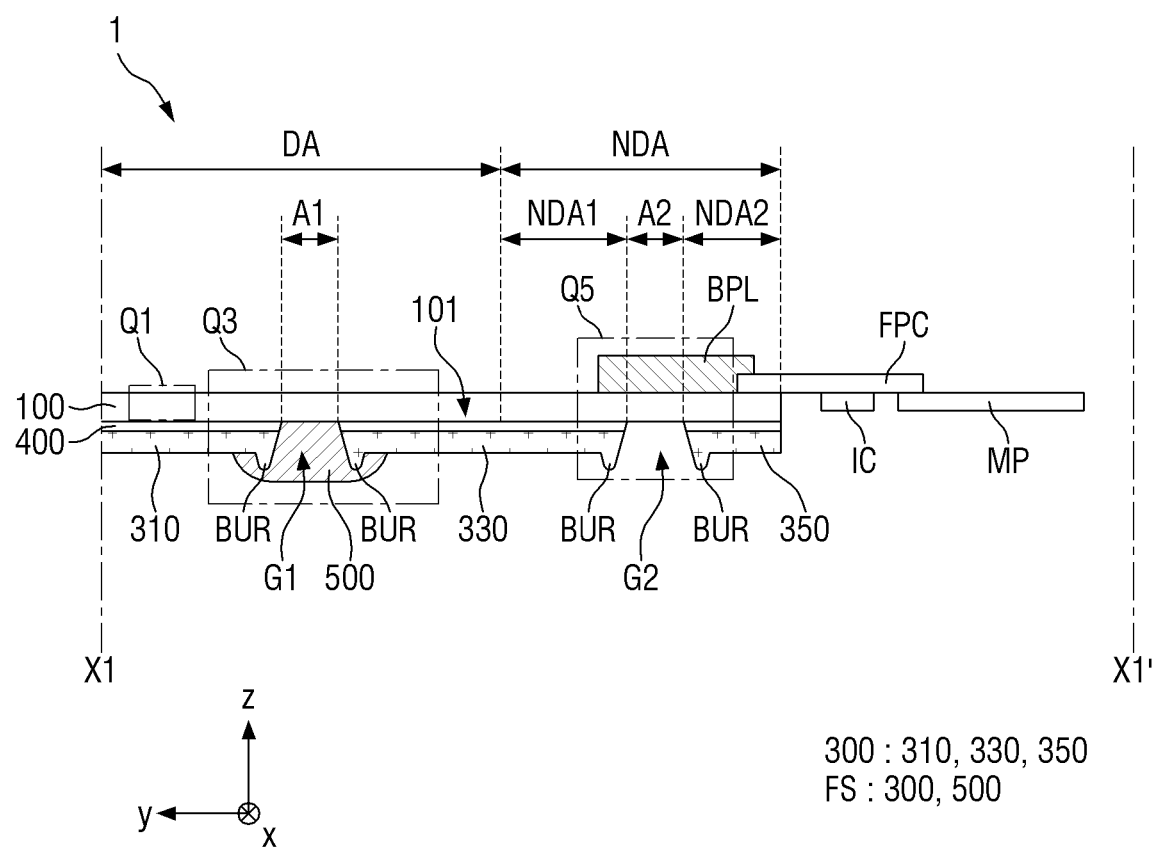
FIG. 5 is a cross-sectional view taken along sectional line X1-X1' of FIG. 2 according to some exemplary embodiments.
Figure 6:
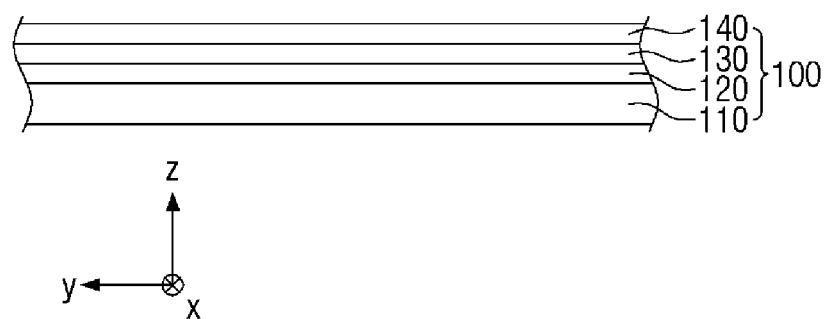
FIG. 6 is an enlarged cross-sectional view of a portion Q1 of FIG. 5 according to some exemplary embodiments.
Figure 7:
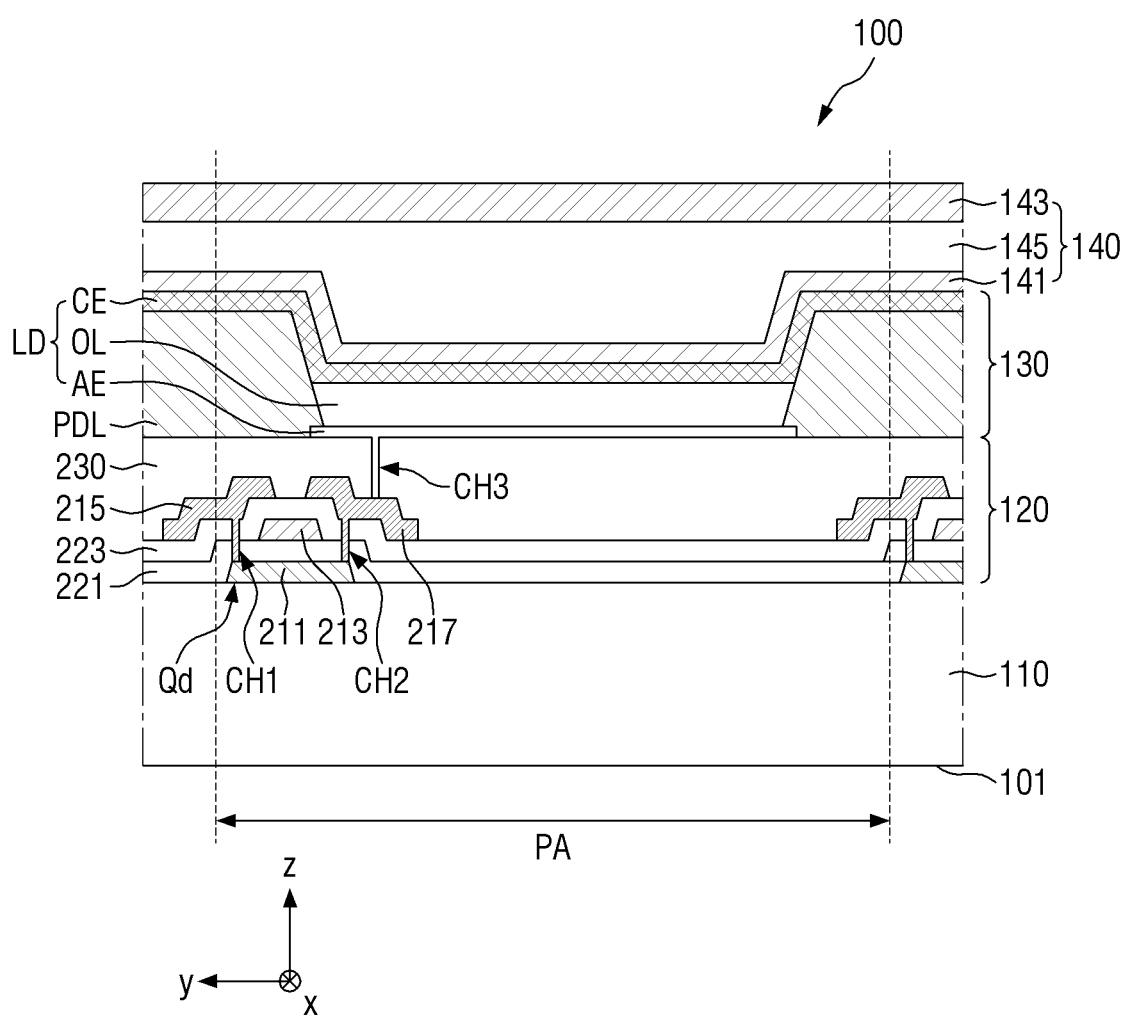
FIG. 7 is a cross-sectional view showing a pixel structure of a display panel of the display device of FIG. 1 according to some exemplary embodiments.
Figure 8:
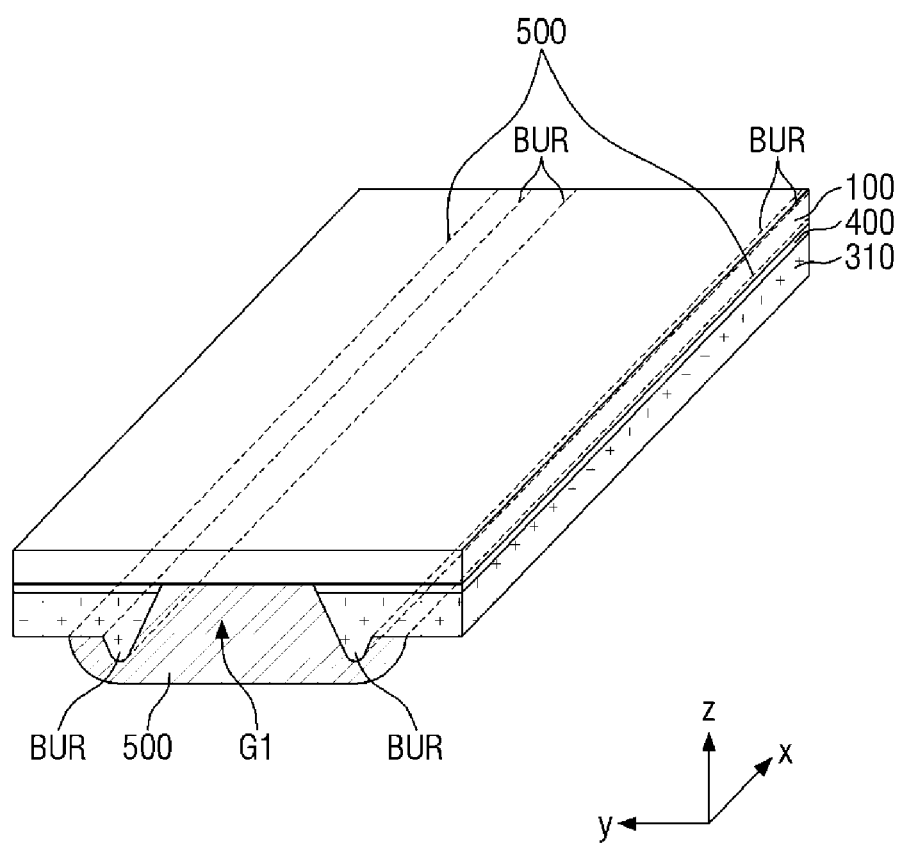
FIG. 8 is a perspective view of a portion Q3 of FIG. 5 according to some exemplary embodiments.
Figure 9:
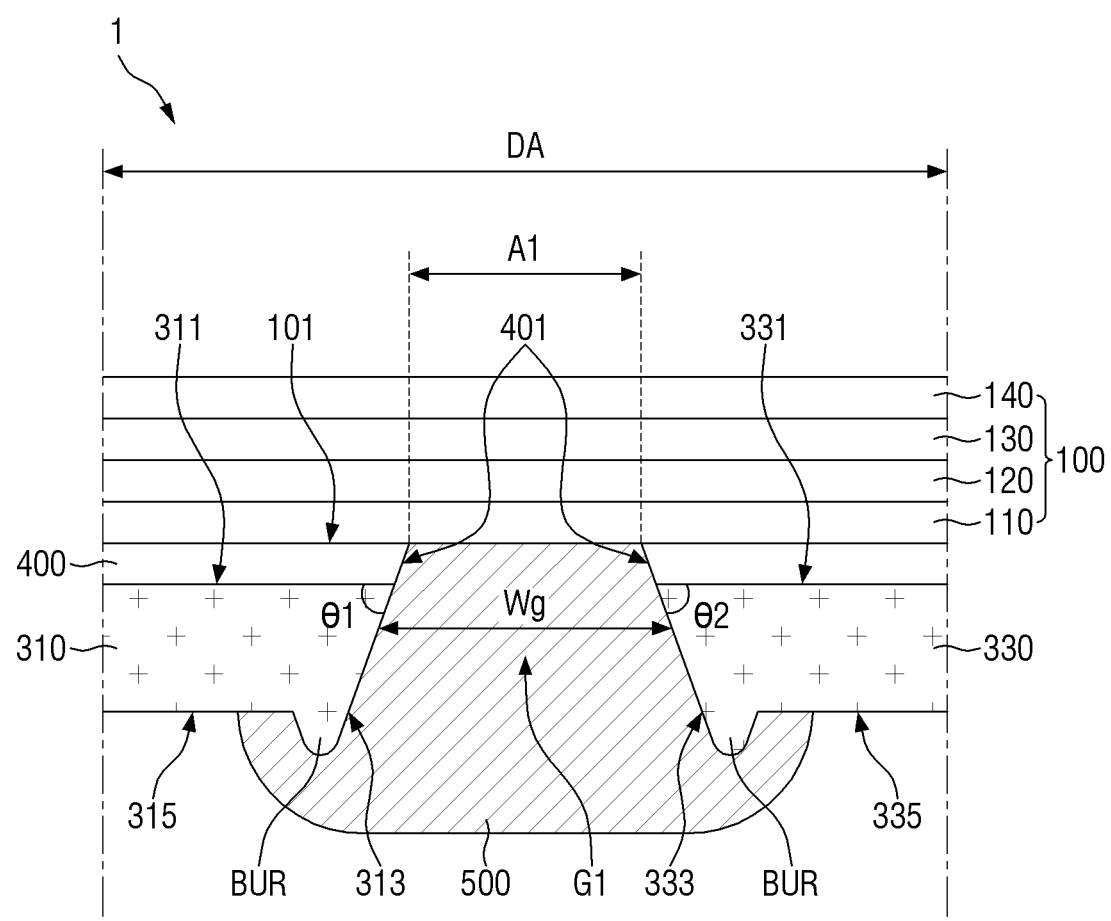
FIG. 9 is an enlarged cross-sectional view of the portion Q3 of FIG. 5 according to some exemplary embodiments.
Figure 10:
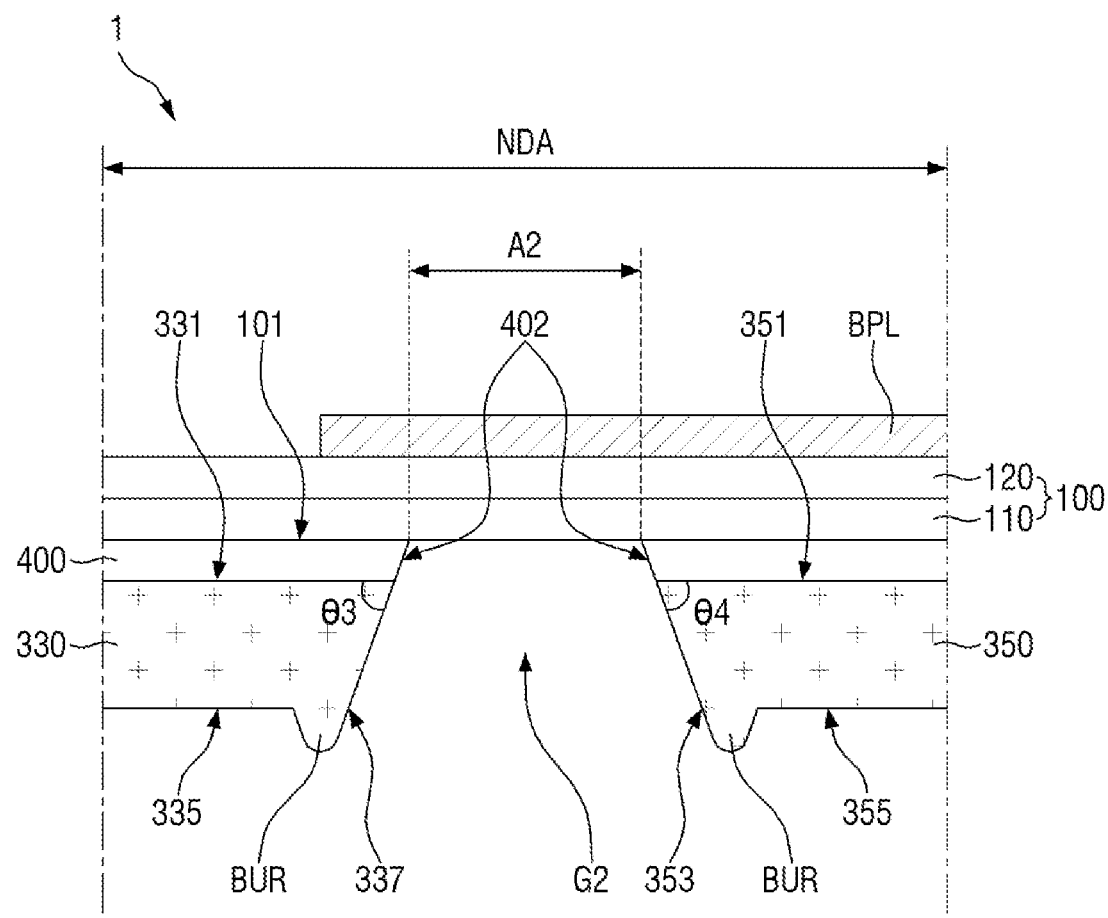
FIG. 10 is an enlarged cross-sectional view of a portion Q5 of FIG. 5 according to some exemplary embodiments.

FIG. 5 is a cross-sectional view taken along sectional line X1-X1' of FIG. 2 according to some exemplary embodiments. FIG. 6 is an enlarged cross-sectional view of a portion Q1 of FIG. 5 according to some exemplary embodiments. FIG. 7 is a cross-sectional view showing a pixel structure of a display panel of the display device of FIG. 1 according to some exemplary embodiments. FIG. 8 is a perspective view of a portion Q3 of FIG. 5 according to some exemplary embodiments. FIG. 9 is an enlarged cross-sectional view of the portion Q3 of FIG. 5 according to some exemplary embodiments. FIG. 10 is an enlarged cross-sectional view of a portion Q5 of FIG. 5 according to some exemplary embodiments.

Referring to FIGS. 5 through 10, the display panel 100 of the display device 1 may include a base substrate 110, a driving layer 120, an organic light-emitting element layer 130, and an encapsulation layer 140. The base substrate 110 provides a bottom surface 101 of the display panel 100. The base substrate 110 may be a flexible substrate and may include a plastic material with relatively excellent heat resistance and durability, such as polyethylene ether phthalate, PEN, PC, polyarylate, polyether imide, PES, or PI. For convenience, it is assumed that the base substrate 110 includes PI.

The driving layer 120 may include elements for providing signals to the organic light-emitting element layer 130. The driving layer 120 may include various signal lines, for example, scan lines (not illustrated), data lines (not illustrated), power lines (not illustrated), and emission lines (not illustrated). The driving layer 120 may include a plurality of transistors and a plurality of capacitors. The transistors may include a switching transistor (not illustrated) and a driving transistor Qd. Each pixel (not shown) of the display panel 100 may include a corresponding switching transistor and a corresponding driving transistor Qd.

FIG. 7 illustrates the driving transistor Qd of the driving layer 120. The driving transistor Qd includes an active layer 211, a gate electrode 213, a source electrode 215, and a drain electrode 217.

The active layer 211 may be disposed on the base substrate 110. The driving layer 120 may further include a first insulating film 221 disposed between the active layer 211 and the gate electrode 213. The first insulating film 221 may insulate the active layer 211 and the gate electrode 213 from each other. The source electrode 215 and the drain electrode 217 may overlap respective portions of the gate electrode 213. The driving layer 120 may further include a second insulating film 223 disposed between the gate electrode 213 and the source electrode 215 and between the gate electrode 213 and the drain electrode 217. The source electrode 215 and the drain electrode 217 may be connected to the active layer 211 via contact holes CH1 and CH2, respectively, that are formed in the first and second insulating films 221 and 223.

The driving layer 120 may further include a passivation film 230 disposed on the source electrode 215 and the drain electrode 217.

Although not specifically illustrated in FIG. 7, the switching transistor may have substantially the same structure as, or a similar structure to, the driving transistor Qd, but exemplary embodiments are not limited thereto. That is, alternatively, the switching transistor and the driving transistor Qd may have different structures. For example, an active layer of the switching transistor and the active layer 211 of the driving transistor Qd may be placed on different layers.

In some exemplary embodiments, the driving layer 120 may be disposed not only in the display area DA, but also in the non-display area NDA. Parts of the driving layer 120 disposed in the first non-display area NDA1, the second area A2, and the second non-display area NDA2 may include wires and/or pad portions electrically connected to the flexible PCB FPC.

The organic light-emitting element layer 130 may include an organic light-emitting element LD, which is an emissive element. The organic light-emitting element LD may be of a top emission-type and may emit light in an upward direction, i.e., in the Z-axis direction.

The organic light-emitting element LD may include a first electrode AE, an organic layer OL, and a second electrode CE.

The first electrode AE is disposed on the passivation film 230. The first electrode AE is connected to the drain electrode 217 via a contact hole CH3, which is formed in the passivation film 230. The first electrode AE may be a pixel electrode or an anode. The first electrode AE may be a transflective electrode or a reflective electrode. In a case where the first electrode AE is a transflective or reflective electrode, the first electrode AE may include at least one of silver (Ag), magnesium (Mg), aluminum (Al), platinum (Pt), palladium (Pd), gold (Au), nickel (Ni), neodymium (Nd), iridium (Ir), and chromium (Cr), and an alloy of at least one of these materials.

The first electrode AE may have a single- or multi-layer structure formed of a metal oxide or a metal. For example, the first electrode AE may have a single-layer structure including indium tin oxide (ITO), Ag, or a mixture of metals (e.g., a mixture of Ag and Mg), a double-layer structure including ITO/Mg or ITO/MgF, or a triple-layer structure including ITO/Ag/ITO, but exemplary embodiments are not limited thereto.

The organic layer OL may include an organic emission layer (EML) formed of a low-molecular organic material or a polymer organic material. The organic EML may emit light based on a voltage difference between the first electrode AE and the second electrode CE. Although not shown, the organic layer OL may further include at least one of a hole transport layer (HTL), a hole injection layer (HIL), an electron transport layer (ETL), and an electron injection layer (EIL). Accordingly, holes from the first electrode AE and electrons from the second electrode CE may be injected into the organic layer OL. The holes and the electrons may be combined to generate excitons in the organic EML, and as the excitons fall from the excited state to the ground state, light may be emitted.

The second electrode CE may be disposed on the organic layer OL. The second electrode CE may be a common electrode or a cathode. The second electrode CE may be a transmissive or transflective electrode. In a case where the second electrode CE is a transmissive or transflective electrode, the second electrode CE may include at least one of Li, Liq, Ca, LiF/Ca, LiF/Al, Al, Mg, BaF, Ba, and Ag, or a compound or mixture of at least one of these materials, e.g., a mixture of Ag and Mg.

Although not shown, the second electrode CE may include an auxiliary electrode. The auxiliary electrode may include a film formed by depositing at least one of Li, Liq, Ca, LiF/Ca, LiF/Al, Al, Mg, BaF, Ba, and Ag, or a compound or mixture of at least one of these materials to face the organic emission layer EML and an oxide of a transparent metal (such as at least one of ITO, indium zinc oxide (IZO), zinc oxide (ZnO), and indium tin zinc oxide (ITZO)) formed on the film, or may include at least one of molybdenum (Mo), titanium (Ti), and Ag.

The organic light-emitting element layer 130 may further include a pixel-defining film PDL disposed on the passivation film 230. The pixel-defining film PDL may overlap with the boundaries of a pixel region PA in a plan view.

In some exemplary embodiments, the organic light-emitting element LD of the organic light-emitting element layer 130 may be disposed in the display area DA, but not in the non-display area NDA. For convenience, it is assumed that the organic light-emitting element layer 130 is not disposed in the non-display area NDA.

The encapsulation layer 140 may be disposed on the organic light-emitting element layer 130. The encapsulation layer 140 can protect the organic light-emitting element layer 130 against (or from) external moisture and air.

In some exemplary embodiments, the encapsulation layer 140 may be formed as a thin-film encapsulation layer and may include at least one organic film and at least one inorganic film. For example, the encapsulation layer 140 may include a first inorganic film 141 disposed on the second electrode CE, an organic film 145 disposed on the first inorganic film 141, and a second inorganic film 143 disposed on the organic film 145.

The first inorganic film 141 may be disposed on the organic light-emitting element LD and can prevent the penetration of moisture and air (e.g., oxygen) into the organic light-emitting element LD. In some exemplary embodiments, the first inorganic film 141 may include an inorganic material. Examples of the inorganic material include at least one selected from the group consisting of silicon oxide (SiOx), silicon nitride (SiNx), and silicon oxynitride (SiONx).

The organic film 145 may be disposed on the first inorganic film 141. The organic film 145 may improve flatness. The organic film 145 may include an organic material. Examples of the organic material include at least one selected from the group consisting of epoxy, acrylate, and urethane acrylate.

The second inorganic film 143 may be disposed on the organic film 145. The second inorganic film 143 may perform substantially the same functions as, or similar functions to, the first inorganic film 141, and may include substantially the same material as, or a similar material to, the first inorganic film 141. The second inorganic film 143 may completely cover the organic film 145. In some exemplary embodiments, the second inorganic film 143 and the first inorganic film 141 may be in contact with each other outside the display area DA and may, thus, form an inorganic-inorganic junction, in which case, the penetration of moisture and the like into the display device 1 from outside the display device 1 can be effectively prevented.

Although FIG. 7 illustrates the first inorganic film 141, the organic film 145, and the second inorganic film 143 as being single-layer films, exemplary embodiments are not limited thereto. For instance, at least one of the first inorganic film 141, the organic film 145, and the second inorganic film 143 may be formed as a multilayer film.

In a case where at least one of the first and second inorganic films 141 and 143 is formed as a multilayer film, at least one layer that forms each of the first and second inorganic films 141 and 143 may be a hexamethyldisiloxane (HMDSO) layer. In this case, since an HMDSO layer can absorb stress, the encapsulation layer 140 can become more flexible. In is another example, the organic film 145 may be replaced with an HMDSO layer.

The encapsulation layer 140 may not completely cover the non-display area NDA of the display panel 100. For example, the encapsulation layer 140 may not be disposed in the first non-display area NDA1, the second area A2, and the second non-display area NDA2. As another example, the encapsulation layer 140 may be disposed in the first non-display area NDA1, but not in the second area A2 and the second non-display area NDA2. For convenience, it is assumed that the encapsulation layer 140 is disposed in the display area DA, but not in the first non-display area NDA1, the second area A2, and the second non-display area NDA2.

As described above, the resin layer 400 is disposed on the bottom surface 101 of the display panel 100, and the support film 300 is disposed below the resin layer 400. The first and second grooves G1 and G2 that respectively overlap with the first and second areas A1 and A2 of the display panel 100 may be defined in the resin layer 400 and the support film 300. The support film 300 may include the first, second, and third film portions 310, 330, and 350. The first and second film portions 310 and 330 may be separated by the first groove G1, and the second and third film portions 330 and the 350 may be separated by the second groove G2.

In some exemplary embodiments, the resin layer 400 may include inner sides 401, which define the first groove G1, and inner sides 402, which define the second groove G2.

The first film portion 310 may include an inner side 313 near the first groove G1, a top surface 311 facing the resin layer 400, and a bottom surface 315 opposite to the top surface 311.

The second film portion 330 may include an inner side 333 near the first groove G1, an inner side 337 near the second groove G2, a top surface 331 facing the resin layer 400, and a bottom surface 335 opposite to the top surface 331.

The third film portion 350 may include an inner side 353 near the second groove G2, a top surface 351 facing the resin layer 400, and a bottom surface 355 opposite to the top surface 351.

The first groove G1 may be defined by the inner sides 401 of the resin layer 400, the inner side 313 of the first film portion 310, and the inner side 333 of the second film portion 330. The second groove G2 may be defined by the inner sides 402 of the resin layer 400, the inner side 337 of the second film portion 330, and the inner side 353 of the third film portion 350.

In some exemplary embodiments, since the first groove G1 is formed by applying laser light, an angle θ1 formed by the top surface 311 and the inner side 313 of the first film portion 310 may be an acute angle, and an angle θ2 formed by the top surface 331 and the inner side 333 of the second film portion 330 may also be an acute angle.

Thus, in some exemplary embodiments, a width Wg, in the second direction Y, of the first groove G1 may gradually decrease with decreasing distance to (or from) the display panel 100. Also, in some exemplary embodiments, the distance, in the second direction Y, between the top surface 311 of the first film portion 310 and the top surface 331 of the second film portion 330 may be smaller than the distance, in the second direction Y, between the bottom surface 315 of the first film portion 310 and the bottom surface 335 of the second film portion 330.

An angle θ3 formed by the top surface 331 and the inner side 337 of the second film portion 330 may be an acute angle, and an angle θ4 formed by the top surface 351 and the inner side 353 of the third film portion 350 may also be an acute angle. Thus, the width, in the second direction Y, of the second groove G2, like the width Wg, in the second direction Y, of the first groove G1, may gradually decrease with decreasing distance to the display panel 100. Also, in some exemplary embodiments, the distance, in the second direction Y, between the top surface 351 of the third film portion 350 and the top surface 331 of the second film portion 330 may be smaller than the distance, in the second direction Y, between the bottom surface 355 of the third film portion 350 and the bottom surface 335 of the second film portion 330.

In some exemplary embodiments, burr patterns BUR may be formed on the bottom surfaces 315 and 335 of the first and second film portions 310 and 330 around the first groove G1. Also, burr patterns BUR may be formed on the bottom surfaces 335 and 355 of the second and third film portions 330 and 350 around the second groove G2. The burr patterns BUR may be formed by parts of the support film 300 being melted by thermal energy of laser light applied during the formation of the first and second grooves G1 and G2.

The burr patterns BUR may be formed together with the first and second grooves G1 and G2. Thus, in some exemplary embodiments, the burr patterns BUR may extend in the same direction as the first and second grooves G1 and G2, e.g., in the first direction X.

The polymer layer 500 may be disposed in the first groove G1. In some exemplary embodiments, the polymer layer 500 may fill the first groove G1. For example, the polymer layer 500 may be formed by applying a polymer in the form of a solution or a paste on the inside of the first groove G1 and drying the polymer.

The polymer layer 500 may be in contact with the inner sides 401 of the resin layer 400, and may also be in contact with the inner sides 313 and 333 of the first and second film portions 310 and 330. In a case where the bottom surface 101 of the display panel 100 is exposed through the first groove G1, the polymer layer 500 may also be in contact with the bottom surface 101 of the display panel 100 or the bottom surface 101 of the base substrate 110 of the display panel 100.

In some exemplary embodiments, the polymer used to form the polymer layer 500 may spill out of the first groove G1, and as a result, the polymer layer 500 may also be formed on the outside of the first groove G1. Accordingly, the polymer layer 500 may be partially in contact with the burr patterns BUR and may also be in contact with at least one of the bottom surfaces 315 and 335 of the first and second film portions 310 and 330.

The polymer layer 500 can prevent the first and second film portions 310 and 330 from being peeled off of the display panel 100 when the display panel 100 is bent or folded in the first area A1. Also, the polymer layer 500 can provide an elastic restoring force to the display panel 100 when the display panel 100 is returning to its original state after being bent or folded.

As described above, the width Wg, in the second direction Y, of the first groove G1 may gradually decrease with decreasing distance to the display panel 100. Thus, the width, in the second direction Y, of the polymer layer 500, which fills the first groove G1, may also gradually decrease with decreasing distance to the display panel 100 along the thickness direction (e.g., the Z direction) of the polymer layer 500.

The support film 300 and the polymer layer 500 may form a support film structure FS for the display device 1 that is disposed below the display panel 100. The support film structure FS includes the polymer layer 500, which overlaps with the first area A1 where the display panel 100 can be repeatedly folded or bent, and the support film 300, in which the first and second grooves G1 and G2 are defined. The support film 300 can protect and support the display panel 100, and the second groove G2 can contribute to bending the display panel 100 in the non-display area NDA. The polymer layer 500 can contribute to improving the reliability of the display device 1 against repeated folding or bending of the display panel 100. That is, the support film structure FS can contribute to realizing a display device 1 with an improved reliability and a reduced bezel width.

A neutral plane adjustment layer BPL may be disposed in the non-display area NDA of the display panel 100. The neutral plane adjustment layer BPL may be disposed to overlap with the second area A2 of the non-display area NDA. In some exemplary embodiments, parts of the neutral plane adjustment layer BPL may be disposed in the first and second non-display areas NDA1 and NDA2.

The neutral plane adjustment layer BPL can prevent cracks in wires (not shown) in the driving layer 120 by alleviating stress applied to the driving layer 120 in the second area A2 where the display panel 100 is bent. For example, the driving layer 120 may include wires passing through the first non-display area NDA1, the second area A2, and the second non-display area NDA2, and the elements in the driving layer 120 may be electrically connected to the flexible PCB FPC and driver integrated chip IC via the wires. The neutral plane adjustment layer BPL adjusts the position of a neutral plane such that tensile stress is not applied to the wires in the second area A2. The neutral plane refers to a plane where neither compressive stress nor tensile stress is applied when the display panel 100 is bent or folded in the second area A2. For example, when the display panel 100 is bent in the second area A2, compressive stress acts on the inside of the curvature of the bent display panel 100, and tensile stress acts on the outside of the curvature of the bent display panel 100. Thus, the direction of stress gradually changes from the compression direction to the tensile direction along the direction from the inside to the outside of the curvature of the bent display panel 100, and there exists a point (or plane) where neither compressive stress nor tensile stress acts. This point becomes the neutral plane. By adjusting the position of the neutral plane with the neutral plane adjustment layer BPL, compressive stress can be applied to the wires in the driving layer 120, and as a result, the risk of cracks in the driving layer 120 can be reduced.

In some exemplary embodiments, the neutral plane adjustment layer BPL may include an organic material, and the organic material may be, for example, a photosensitive organic material. For example, the neutral plane adjustment layer BPL may include an acrylic material.

In some exemplary embodiments, the neutral plane adjustment layer BPL may be in contact with the flexible PCB FPC and may cover a part of the flexible PCB FPC connected to the second non-display area NDA2. Accordingly, the flexible PCB FPC can be prevented from being separated from the second non-display area NDA2, and reliability of the display device 1 can be improved.

Figure 11:
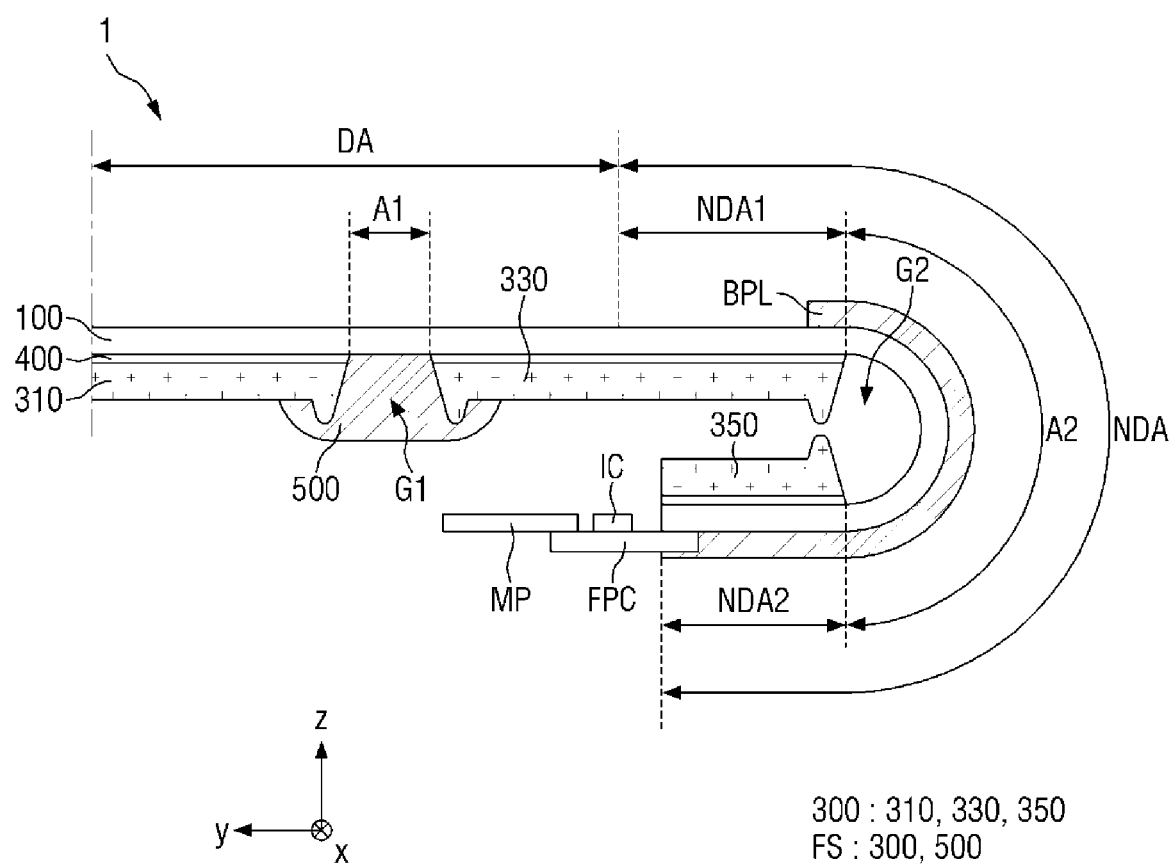
FIG. 11 is a cross-sectional view of the display device of FIG. 5 in a state of being bent, particularly, in a non-display area according to some exemplary embodiments.
Figure 12:
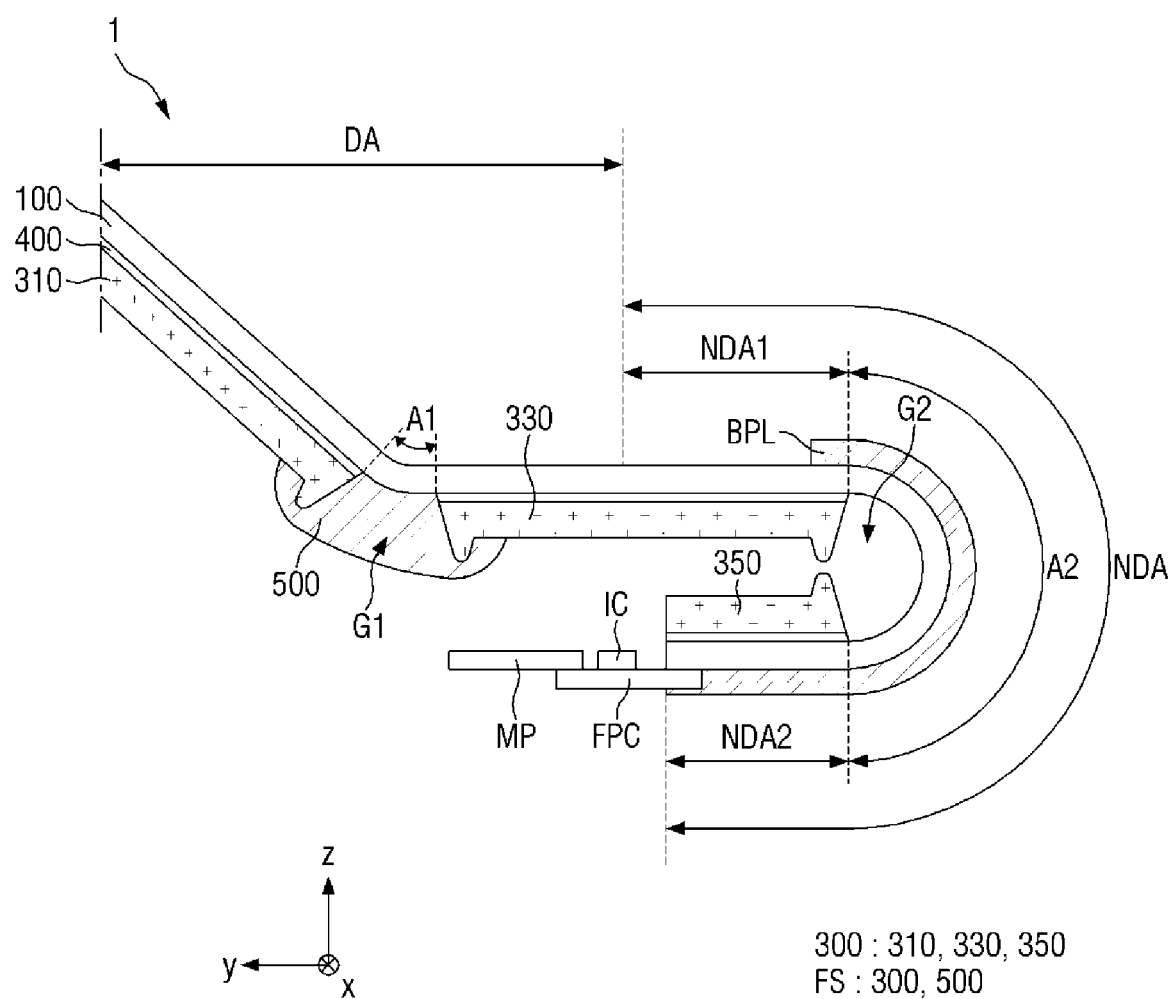
FIG. 12 is a cross-sectional view of the display device of FIG. 5 in a state of being bent, particularly, in a display area and the non-display area according to some exemplary embodiments.
Figure 13:
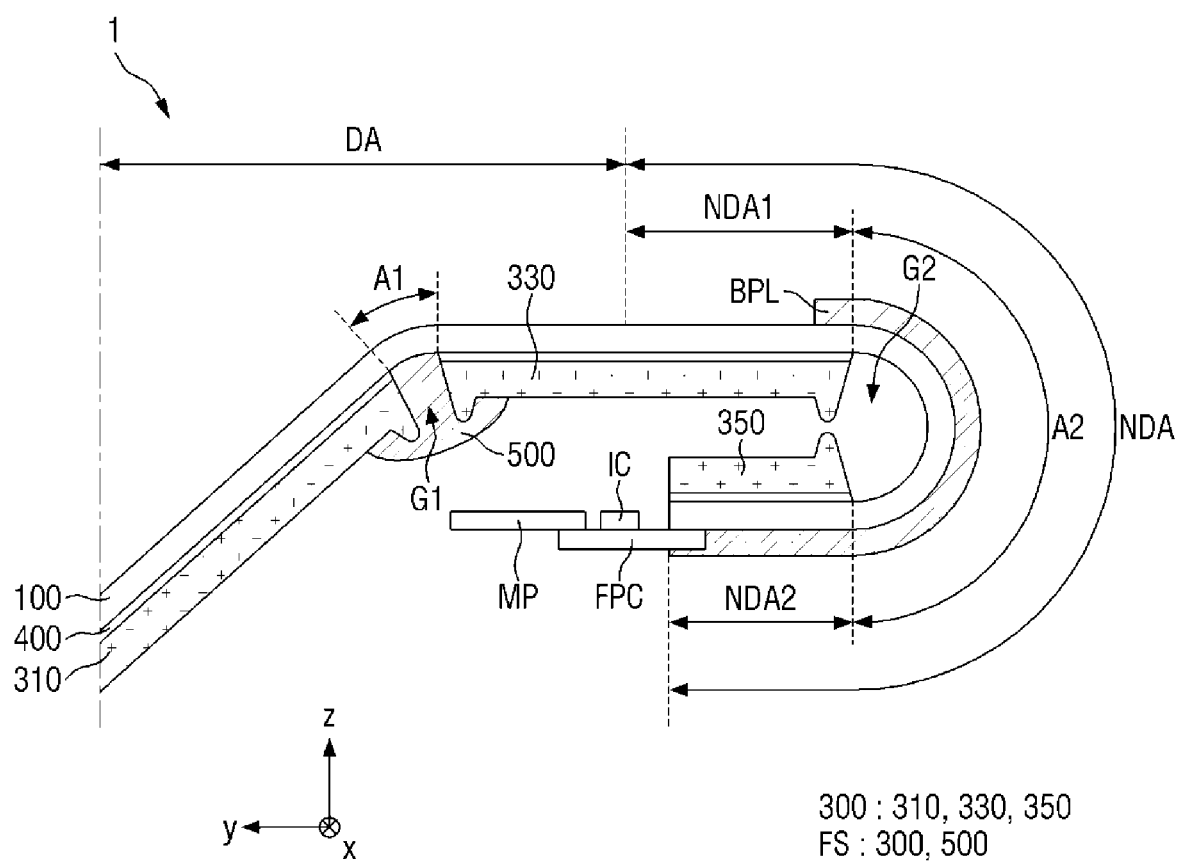
FIG. 13 is a cross-sectional view of the display device of FIG. 5 in a state of being bent, particularly, in the display area and the non-display area according to some exemplary embodiments.

FIG. 11 is a cross-sectional view of the display device of FIG. 5 in a state of being bent, particularly, in a non-display area according to some exemplary embodiments. FIG. 12 is a cross-sectional view of the display device of FIG. 5 in a state of being bent, particularly, in a display area and the non-display area according to some exemplary embodiments. FIG. 13 is a cross-sectional view of the display device of FIG. 5 in a state of being bent, particularly, in the display area and the non-display area according to some exemplary embodiments.

Referring to FIGS. 11 through 13, the display panel 100 of the display device 1 may be bent, in the second area A2, in the downward direction along the bending axis BX2 (see FIG. 1), which extends in the first direction X. Since the second groove G2, which overlaps with the second area A2, is defined in the support film 300, the display panel 100 can be easily bent.

Since the display panel 100 is bent in a part of the non-display area NDA, the non-display area NDA of the display device 1 as viewed from the outside can be reduced, and the bezel width of the display device 1 can be reduced. Also, since the neutral plane adjustment layer BPL, which overlaps with the second area A2, is disposed in the second area A2, the wires in the second area A2 of the display panel 100 can be prevented from cracking, and reliability of the display device 1 can be improved.

The display panel 100 may be folded or bent, in the first area A1, along the bending axis BX1 (see FIG. 1), which extends in the first direction X. In some exemplary embodiments, as illustrated in FIG. 12, the display panel 100 may be folded in the upward direction faced by the display surface thereof. In some exemplary embodiments, as illustrated in FIG. 13, the display panel 100 may be bent in an opposite direction of the display surface, e.g., in the downward direction. That is, the display device 1 may be implemented as an inside folding-type foldable display device and/or an outside folding-type foldable display device.

Since the first groove G1, which overlaps with the first area A1, is defined in at least the support film 300, the display panel 100 can be easily folded or bent. Also, since the polymer layer 500 is disposed in the first groove G1, reliability of the display device 1 can be maintained even when the display panel 100 is repeatedly folded or bent.

Figure 14A:
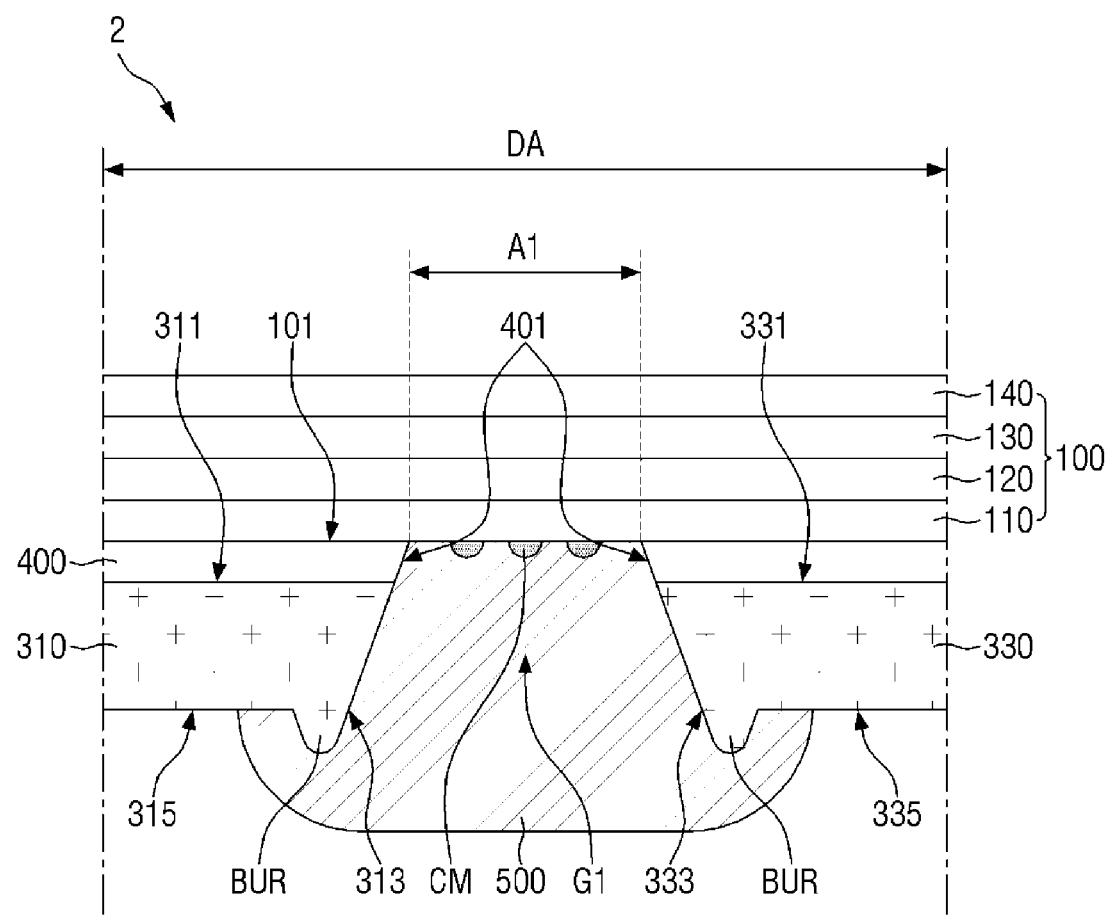
FIG. 14A is an enlarged cross-sectional view of a portion of a display device according to another exemplary embodiment of the present disclosure corresponding to the portion Q3 of FIG. 5.
Figure 14B:
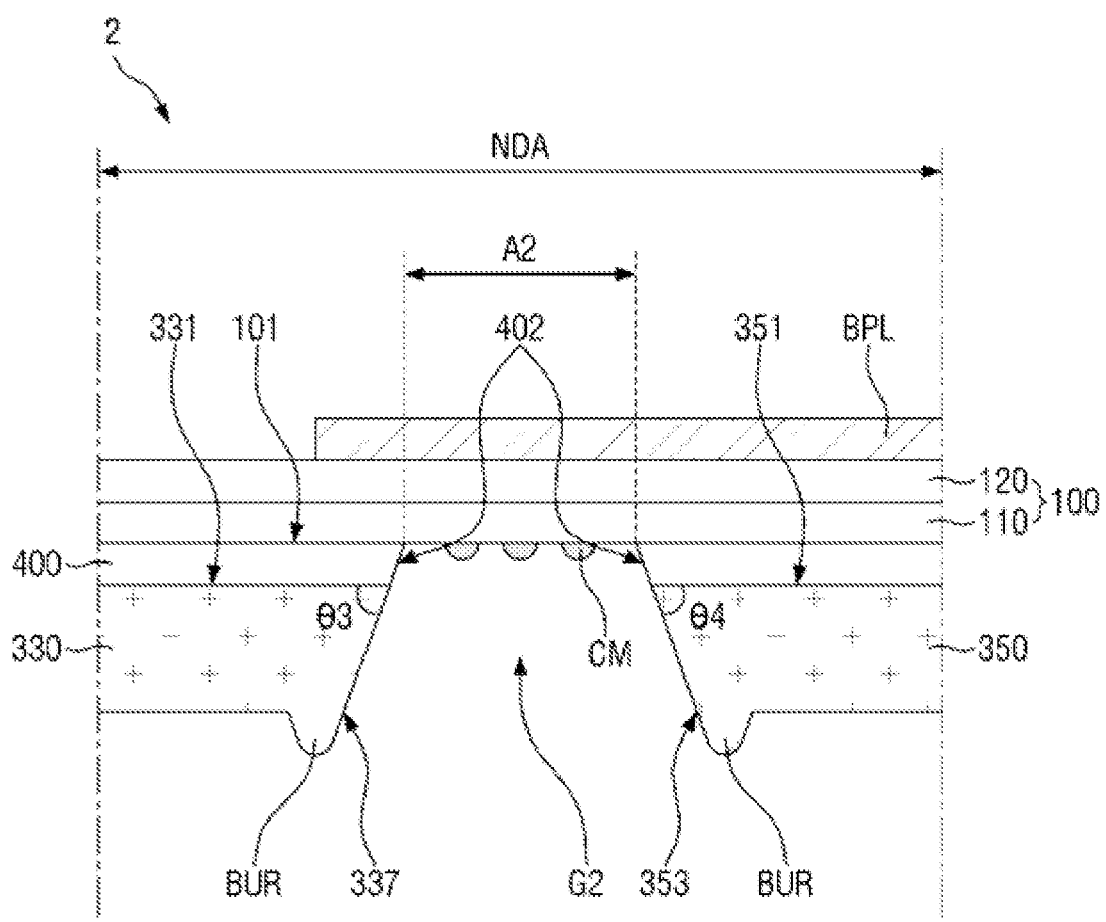
FIG. 14B is an enlarged cross-sectional view of a portion of the display device of FIG. 14 corresponding to the portion Q5 of FIG. 5.

FIG. 14A is an enlarged cross-sectional view of a portion of a display device corresponding to the portion Q3 of FIG. 5 according to some exemplary embodiments. FIG. 14B is an enlarged cross-sectional view of a portion of the display device of FIG. 14A corresponding to the portion Q5 of FIG. 5 according to some exemplary embodiments.

Referring to FIGS. 14A and 14B, a display device 2 is substantially the same as the display device 1, except that the display device 2 further includes a carbide CM. Thus, the display device 2 will hereinafter be described, focusing mainly on the difference with the display device 1.

The carbide CM may be disposed in a first groove G1 of a support film 300. The carbide CM may overlap with a first area A1, may be disposed between a bottom surface 101 of a display panel 100 and a polymer 500, and may be in contact with the polymer layer 500 and the bottom surface 101 of the display panel 100.

As described above, the first groove G1 may be formed by applying laser light to the support film 300. A base substrate 110 of the display panel 100 may be formed of a polymer material having flexibility. Accordingly, the base substrate 110 of the display panel 100 or a resin layer 400 may be partially carbonized, and as a result, the carbide CM may remain on the bottom surface 101 of the display panel 100.

Similarly, the carbide CM may also be disposed in a second groove G2, e.g., may be disposed on the bottom surface 101 of the display panel 100.

As described above, since the carbide CM may be formed in the process of forming the first and second grooves G1 and G2, the carbide CM may not exist on the bottom surface 101 of the display panel 100 outside the first area A1 and a second area A2. Since the carbide CM exists in the first and second areas A1 and A2, light transmittance of the base substrate 110 of the display panel 100 may vary from area to area. For example, the light transmittance of the base substrate 110 may be lower in the first and second areas A1 and A2 than in other areas. Alternatively, although not specifically illustrated, the carbide CM may exist in the first groove G1, but not in the second groove G2. Still alternatively, the carbide CM may not exist in the first groove G1 and may only exist in the second groove G2.

Figure 15A:
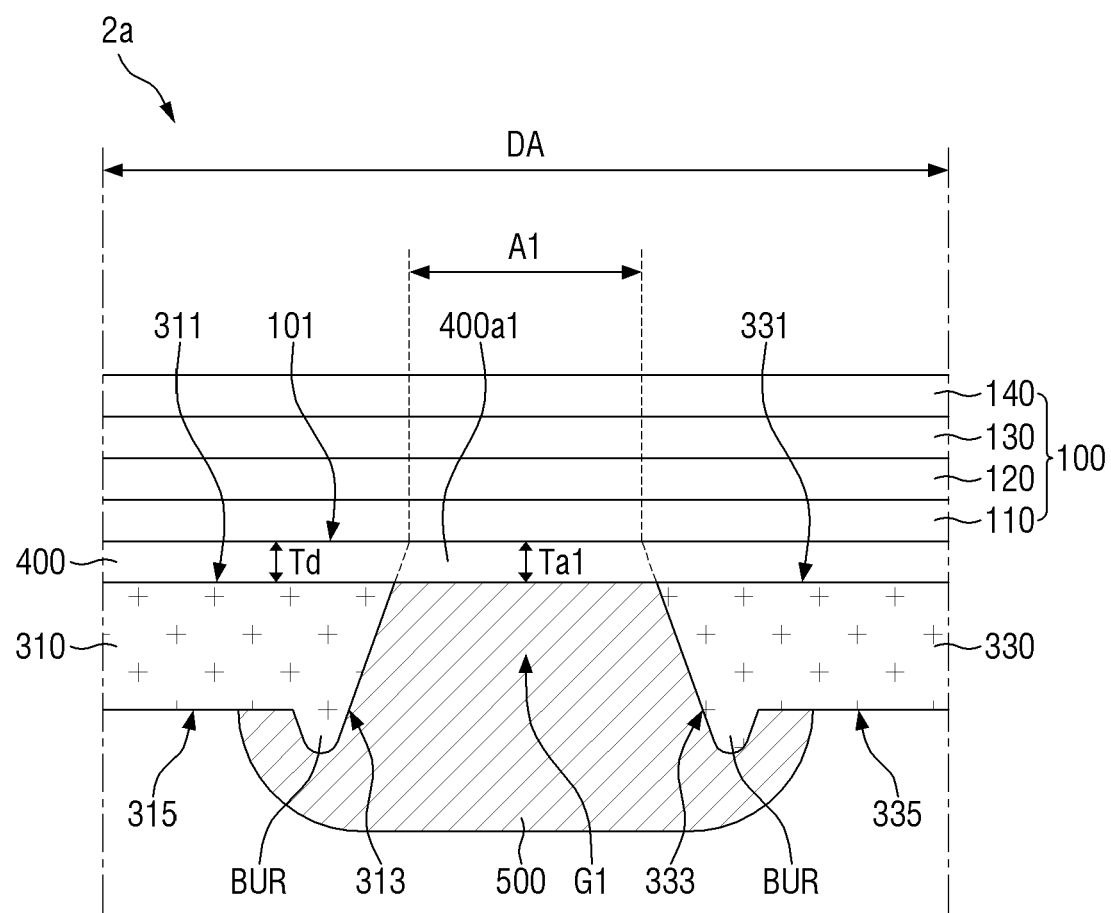
FIG. 15A is an enlarged cross-sectional view of a modified example of FIG. 14A.
Figure 15B:
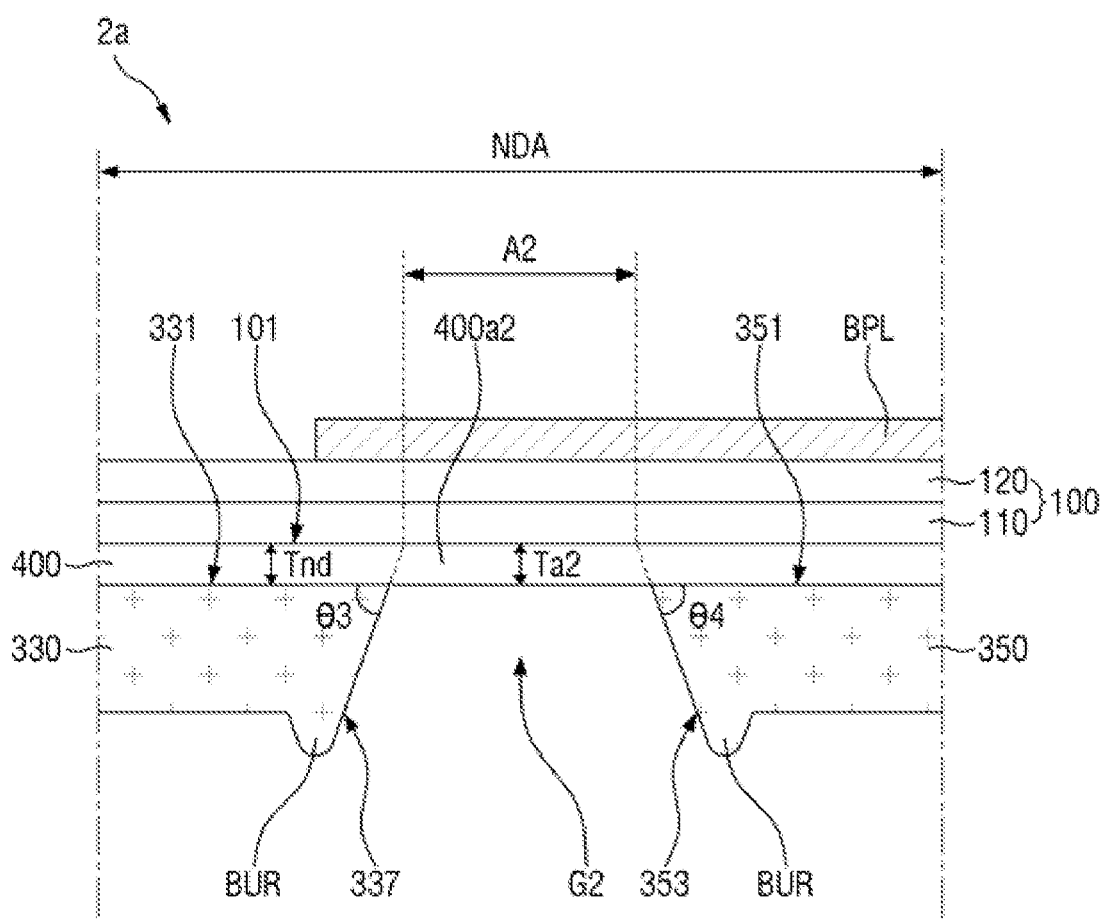
FIG. 15B is an enlarged cross-sectional view of a modified example of FIG. 14B.

FIG. 15A is an enlarged cross-sectional view of a modified example of FIG. 14A, and FIG. 15B is an enlarged cross-sectional view of a modified example of FIG. 14B.

Referring to FIGS. 15A and 15B, a display device 2a may have a resin layer 400 unremoved from first and second areas A1 and A2 thereof. That is, a first portion 400a1, which is a part of the resin layer 400 that is not removed, but remains, may be disposed in the first area A1, and a second portion 400a2, which is another part of the resin layer 400 that is not removed, but remains, may be disposed in the second area A2.

In some exemplary embodiments, a thickness Ta1 of the first portion 400a1 may be substantially the same as a thickness Td of a part of the resin layer 400 disposed in an entire display area DA excluding the first area A1.

In some exemplary embodiments, in a first groove G1, a polymer layer 500 may be in direct contact with the bottom surface of the first portion 400a1.

The first portion 400a1, which is a part of the resin layer 400 that remains in the first area A1, may not expose, but may completely cover, a bottom surface 101 of a display panel 110, but the present disclosure is not limited thereto. Alternatively, the bottom surface 101 of the display panel 110 may be partially exposed in the first area A1, rather than being completely covered by the first portion 400a1.

In some exemplary embodiments, a thickness Ta2 of the second portion 400a2, which is a part of the resin layer 400 that is not removed, may be substantially the same as a thickness Tnd of a part of the resin layer 400 disposed in the entire non-display area NDA excluding the second area A2.

Figure 15C:
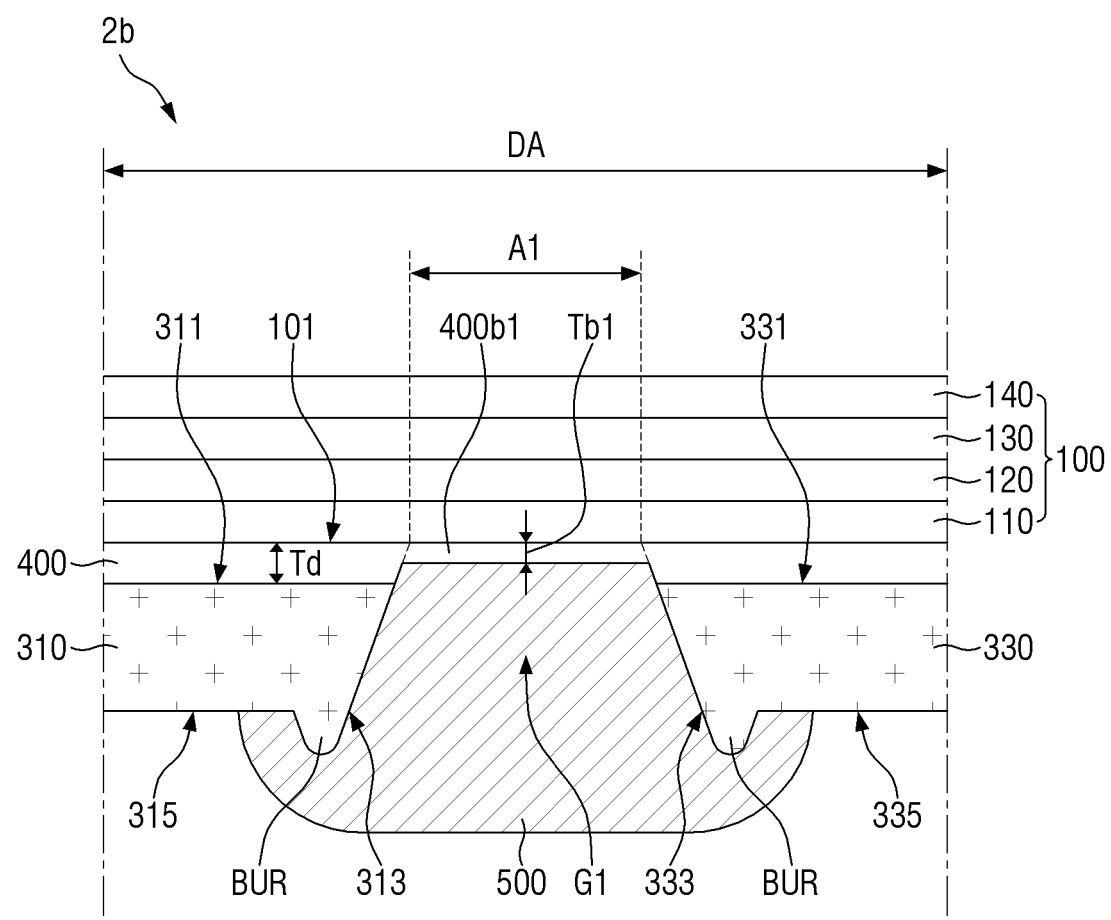
FIG. 15C is an enlarged cross-sectional view of another modified example of FIG. 14A.
Figure 15D:
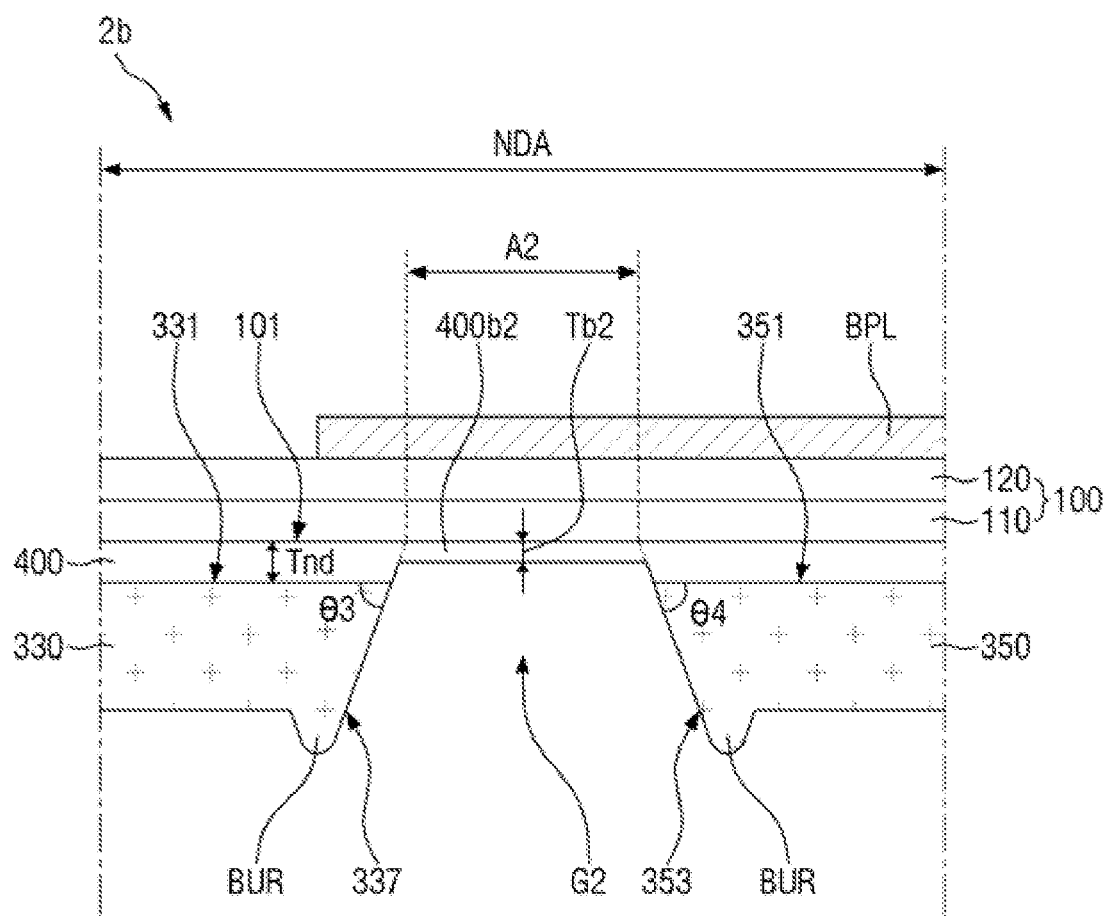
FIG. 15D is an enlarged cross-sectional view of a modified example of FIG. 14B.

FIG. 15C is an enlarged cross-sectional view of another modified example of FIG. 14A, and FIG. 15D is an enlarged cross-sectional view of a modified example of FIG. 14B.

Referring to FIGS. 15C and 15D, a display device 2b may have a resin layer 400 unremoved from first and second areas A1 and A2 thereof.

In some exemplary embodiments, a first portion 400b1, which is a part of the resin layer 400 that remains, may be disposed in the first area A1. In some embodiments, a thickness Tb1 of the first portion 400b1 may be smaller than a thickness Td of a part of the resin layer 400 disposed in an entire display area DA excluding the first area A1.

In some exemplary embodiments, in a first groove G1, a polymer layer 500 may be in direct contact with the sides of the resin layer 400 and the top surface of the first portion 400b1.

The first portion 400b1 may not expose, but may completely cover, a bottom surface 101 of a display panel 110, but the present disclosure is not limited thereto. Alternatively, the bottom surface 101 of the display panel 110 may be partially exposed in the first area A1, rather than being completely covered by the first portion 400b1.

In some exemplary embodiments, a second portion 400b2, which is another part of the resin layer 400 that remains, may be disposed in the second area A2. In some embodiments, a thickness Tb2 of the second portion 400b2 may be smaller than a thickness Tnd of a part of the resin layer 400 disposed in an entire non-display area NDA excluding the second area A2.

Figure 15E:
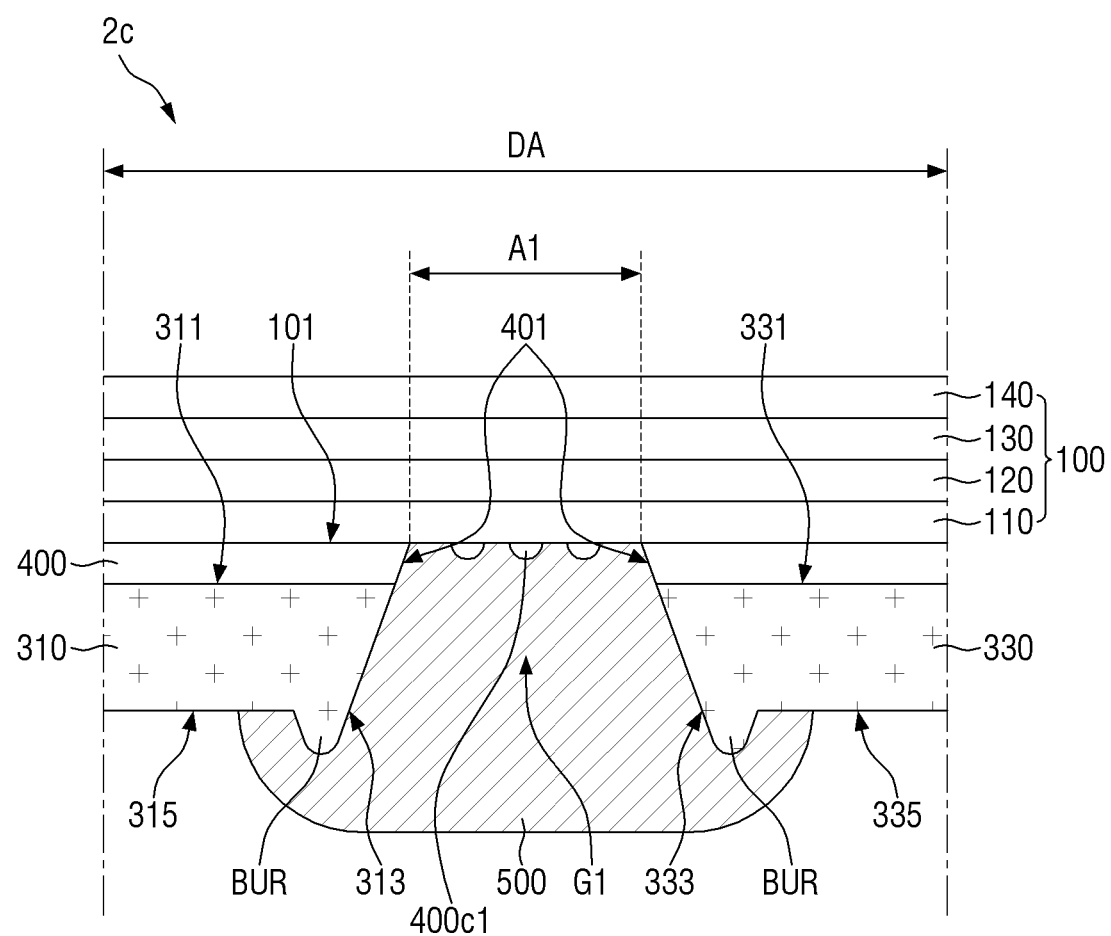
FIG. 15E is an enlarged cross-sectional view of another modified example of FIG. 14A.
Figure 15F:
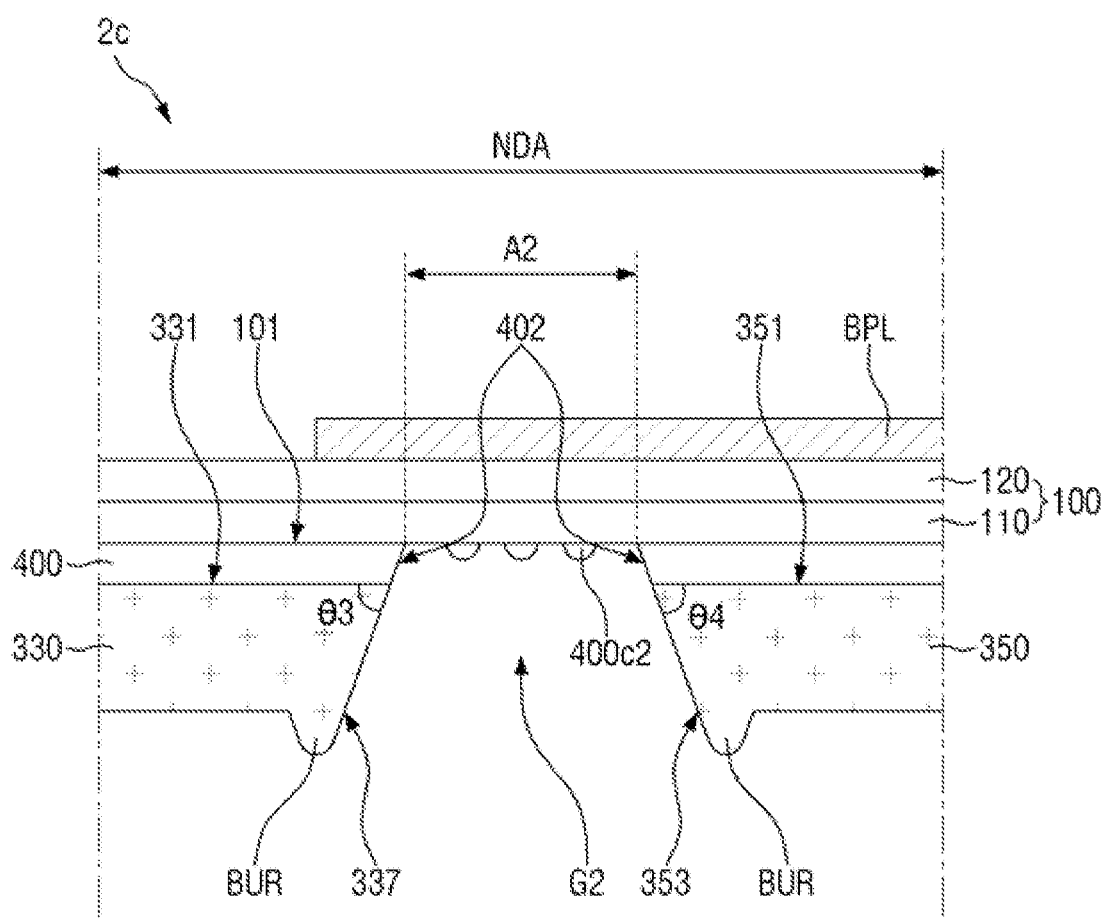
FIG. 15F is an enlarged cross-sectional view of another modified example of FIG. 14B.

FIG. 15E is an enlarged cross-sectional view of another modified example of FIG. 14A, and FIG. 15F is an enlarged cross-sectional view of another modified example of FIG. 14B.

Referring to FIGS. 15E and 15F, a display device 2c may have a resin layer 400 unremoved from first and second areas A1 and A2.

In some exemplary embodiments, first remaining patterns 400c1, which are remains of the resin layer 400, may be disposed in the first area A1. The first remaining patterns 400c1 may not completely cover, but may partially expose, a bottom surface 101 of a display panel 110.

In some exemplary embodiments, in a first groove G1, a polymer layer 400 may be in direct contact with the first remaining patterns 400c1.

In some exemplary embodiments, second remaining patterns 400c2, which are also remains of the resin layer 400, may be disposed in the second area A2. The second remaining patterns 400c2 may not completely cover, but may partially expose, the bottom surface 101 of the display panel 110.

FIGS. 16, 17, 18, 19, 20, and 21 are enlarged cross-sectional views of portions of display devices corresponding to the portion Q3 of FIG. 5 according to some exemplary embodiments.

Figure 16:
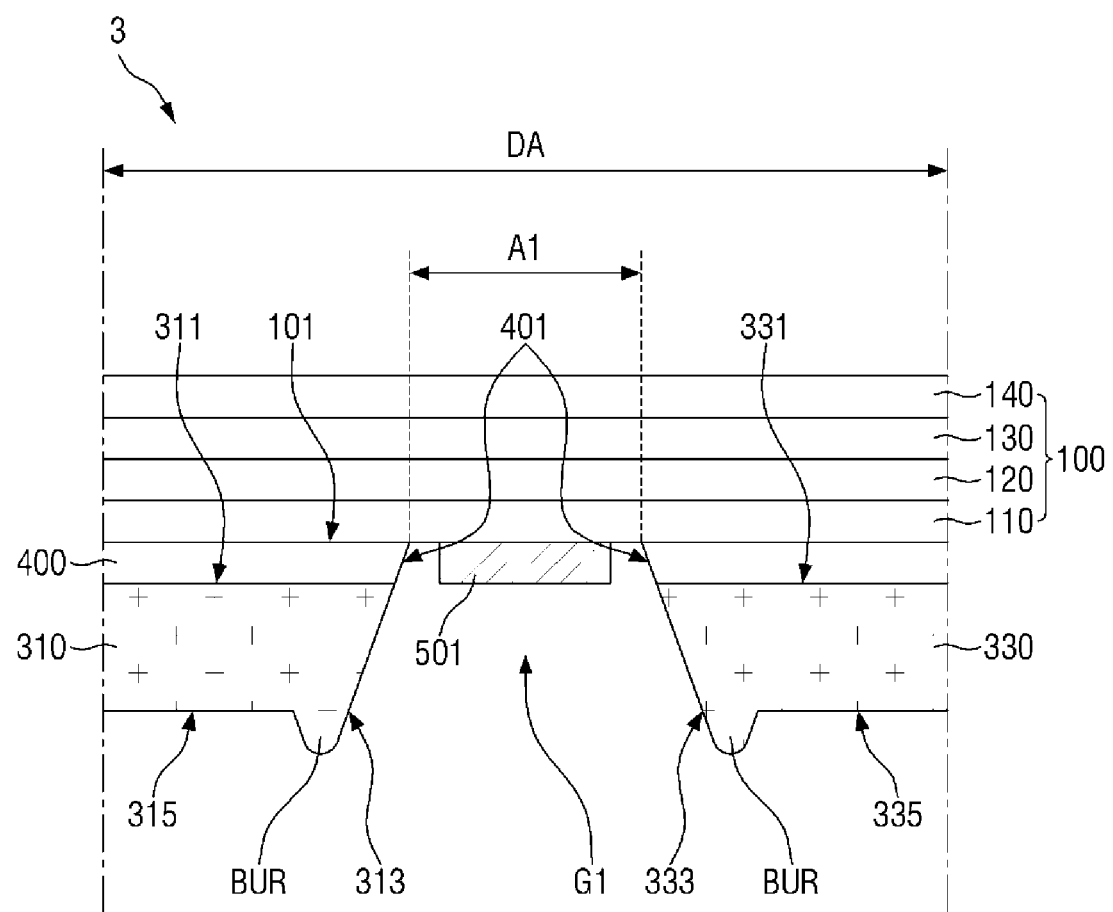
FIGS. 16, 17, 18, 19, 20, and 21 are enlarged cross-sectional views of portions of display devices corresponding to the portion Q3 of FIG. 5 according to some exemplary embodiments.

Referring to FIG. 16, a display device 3 is substantially the same as the display device 1, except for the structure of a support film structure FS1 of the display device 3. Thus, the display device 3 will, hereinafter, be described, focusing mainly on the difference with the display device 1.

The support film structure FS1 may include a support film 300 and a polymer layer 501.

The polymer layer 501 may be formed as an adhesive tape and may be attached on a part of a bottom surface 101 of a display panel 100 exposed through a first groove G1.

In some exemplary embodiments, the polymer layer 501 may be in contact with the bottom surface 101 of the display panel 100 and may be spaced apart from at least one of the inner sides 401 of a resin layer 400, an inner side 313 of a first film portion 310, and an inner side 333 of a second film portion 330. For example, as illustrated in FIG. 16, the polymer layer 501 may be in contact with the bottom surface 101 of the display panel 100 and may be spaced apart from all the inner sides 401 of the resin layer 400, the inner side 313 of the first film portion 310, and the inner side 333 of the second film portion 330.

Figure 17:
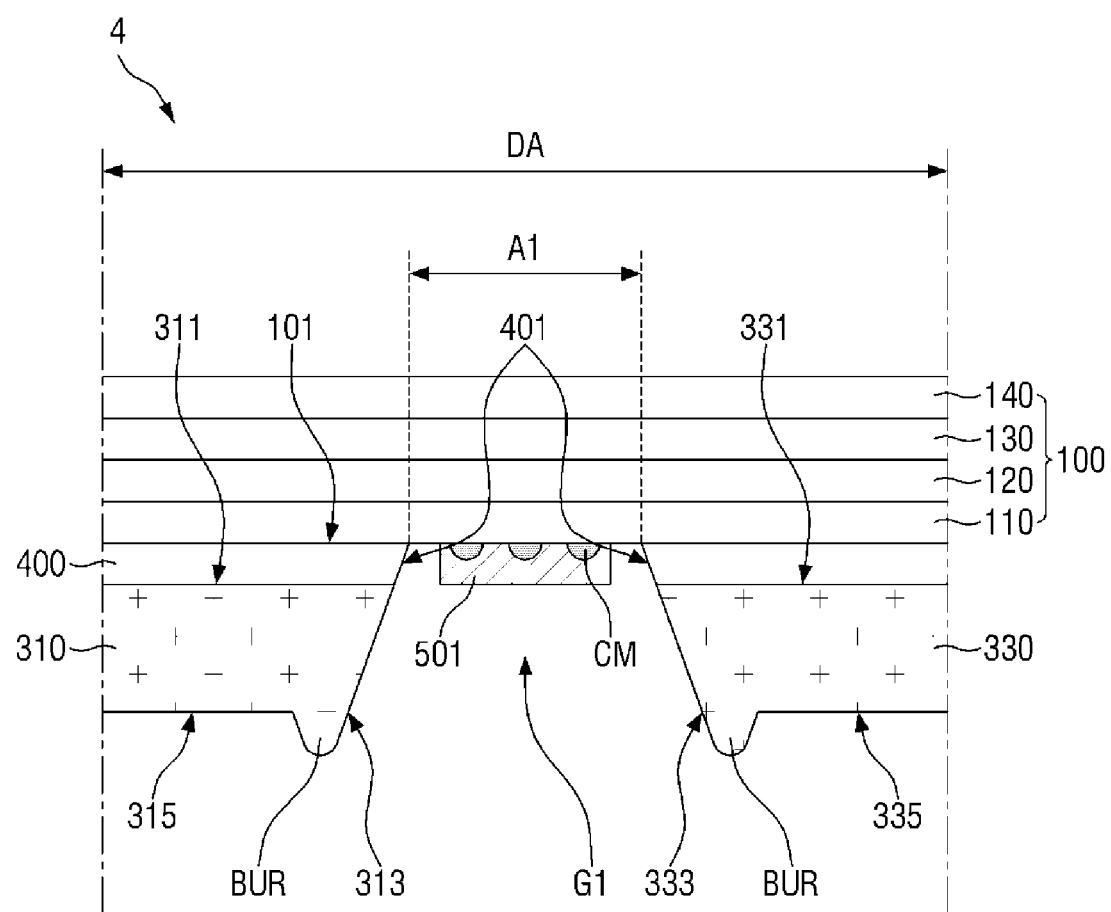

Referring to FIG. 17, a display device 4 is substantially the same as the display device 3, except that a carbide CM is further disposed between, and in contact with, a polymer layer 501 of a support film structure FS1 for the display device 4 and a bottom surface 101 of a display panel 100. Thus, a detailed description of the display device 4 will be omitted.

Figure 18:
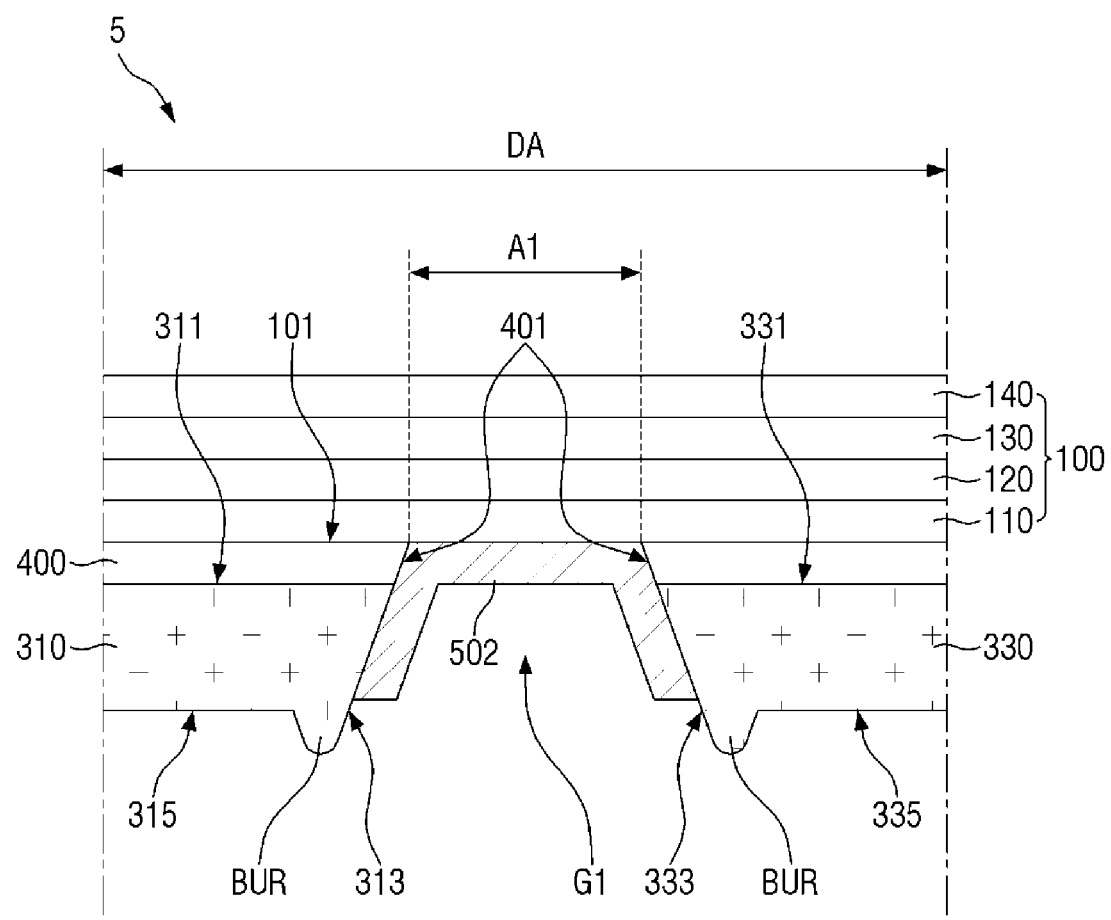

Referring to FIG. 18, a display device 5 is substantially the same as the display device 3, except that a support film structure FS2 for the display device 5 includes a support film 300 and a polymer layer 502 formed as an adhesive tape. The polymer layer 502 is not only in contact with a bottom surface 101 of a display panel 100, but also in contact with inner sides 401 of a resin layer 400, an inner side 313 of a first film portion 310, and an inner side 333 of a second film portion 330. Thus, a detailed description of the display device 5 will be omitted.

Figure 19:
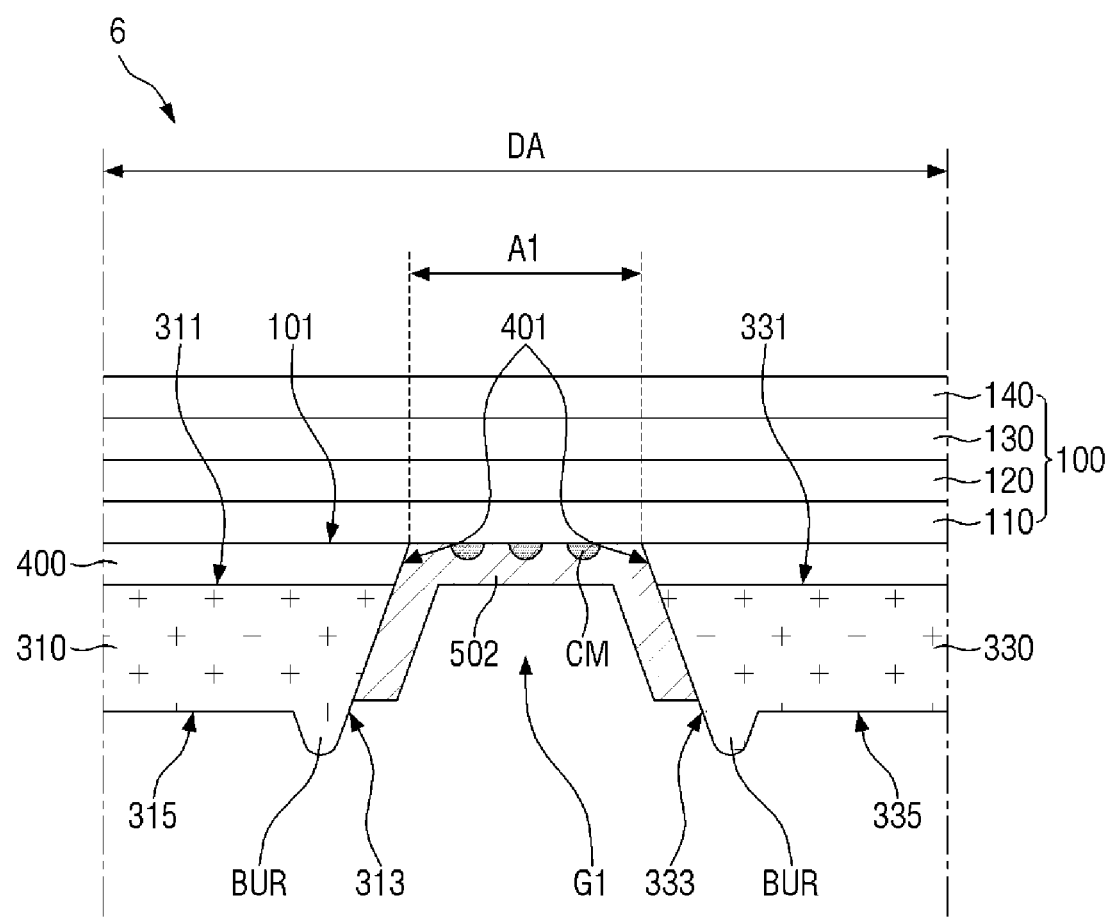

Referring to FIG. 19, a display device 6 is substantially the same as the display device 5, except that a carbide CM is further disposed between, and in contact with, a polymer layer 502 and a bottom surface 101 of a display panel 100. Thus, a detailed description of the display device 6 will be omitted.

Figure 20:
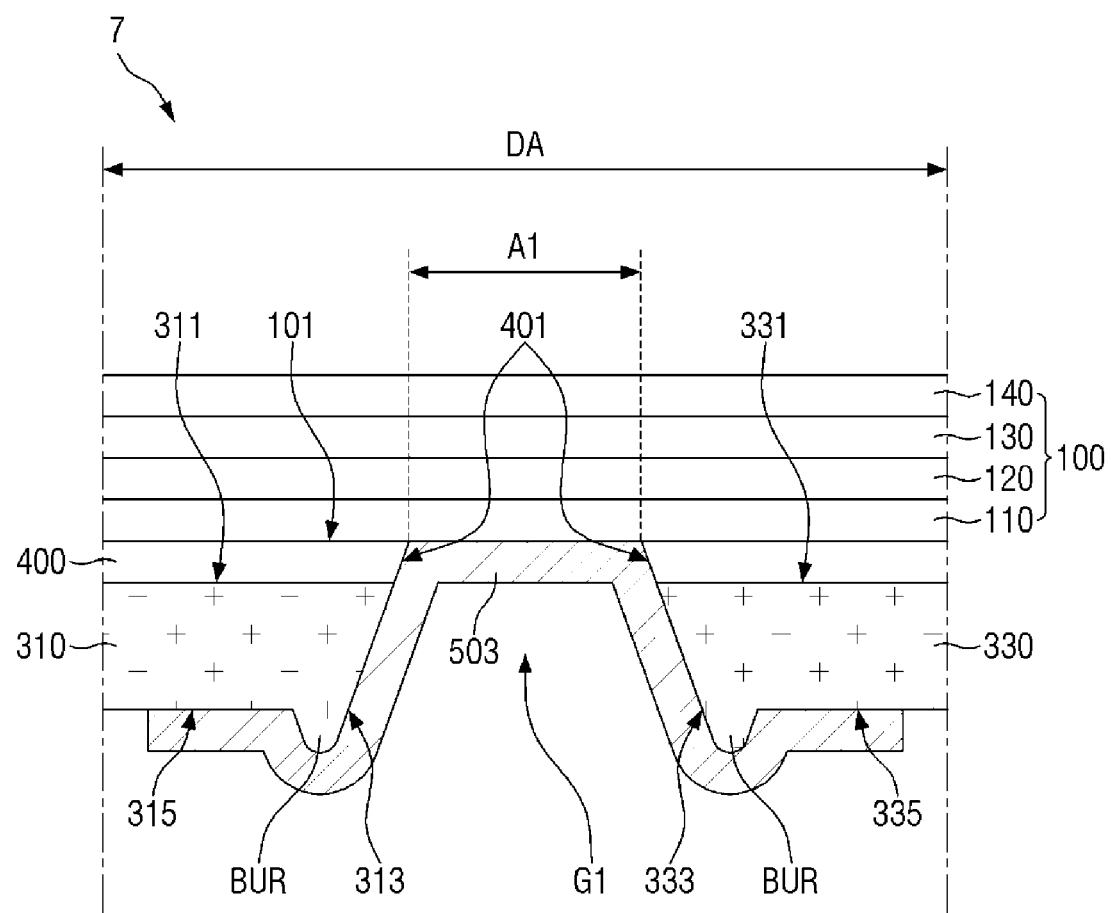

Referring to FIG. 20, a display device 7 is substantially the same as the display device 5, except that a support film structure FS3 for the display device 7 includes a support film 300 and a polymer layer 503 formed as an adhesive tape. The polymer layer 503 is not only in contact with a bottom surface 101 of a display panel 100, inner sides 401 of a resin layer 400, an inner side 313 of a first film portion 310, and an inner side 333 of a second film portion 330, but also in contact with burr patterns BUR, a bottom surface 315 of the first film portion 310, and a bottom surface 335 of the second film portion 330. Thus, a detailed description of the display device 7 will be omitted.

Figure 21:
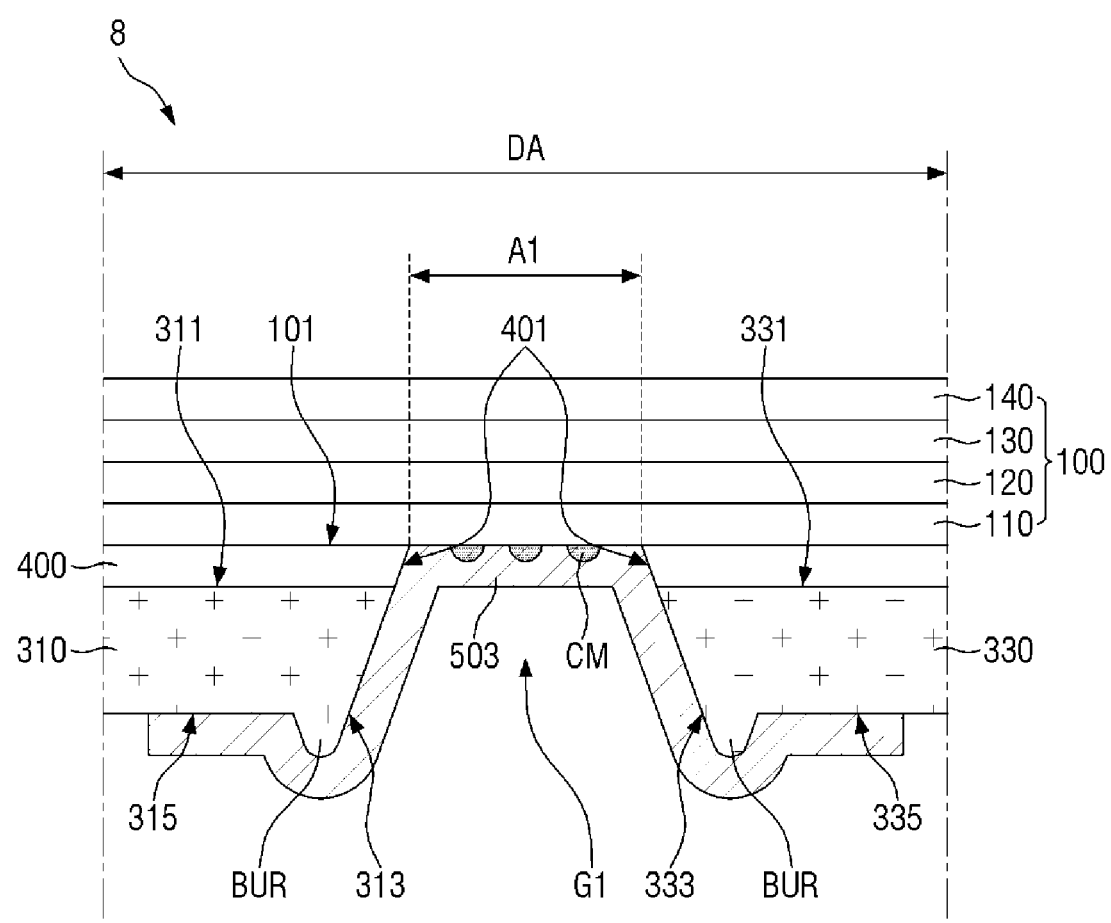

Referring to FIG. 21, a display device 8 is substantially the same as the display device 7, except that a carbide CM is further disposed between, and in contact with, a polymer layer 503 and a bottom surface 101 of a display panel 100. Thus, a detailed description of the display device 8 will be omitted.

The structure of each of the display devices 3 through 8 of FIGS. 16 through 21 in the second area A2 may be substantially the same as that illustrated in FIG. 10, 14B, 15B, 15D, or 15F.

Figure 22:
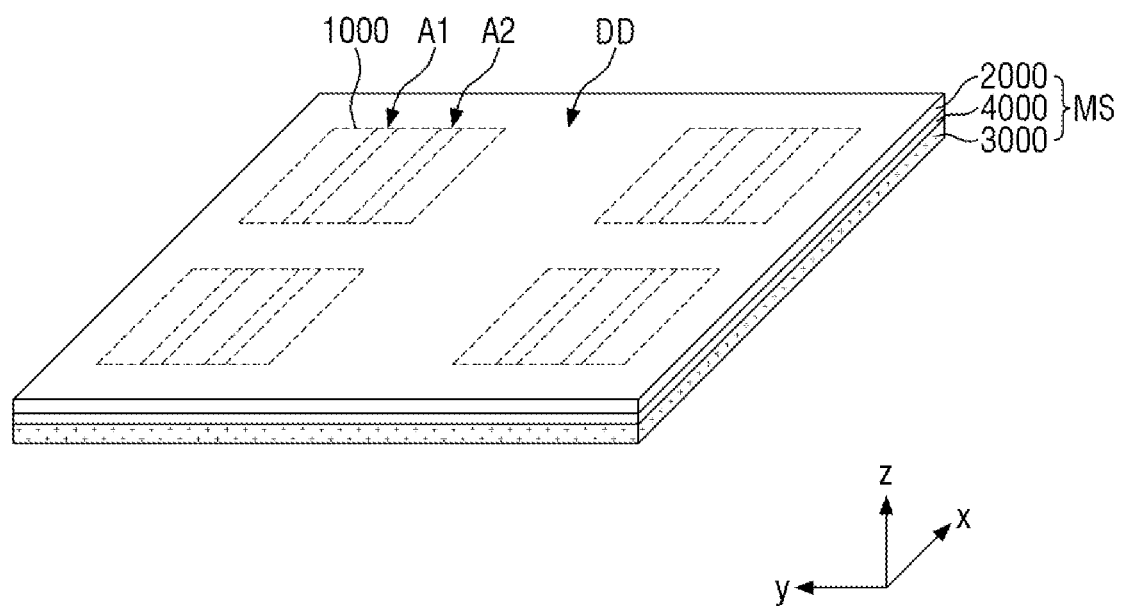
FIG. 22 is a perspective view of a mother board for a display device according to some exemplary embodiments.
Figure 23:
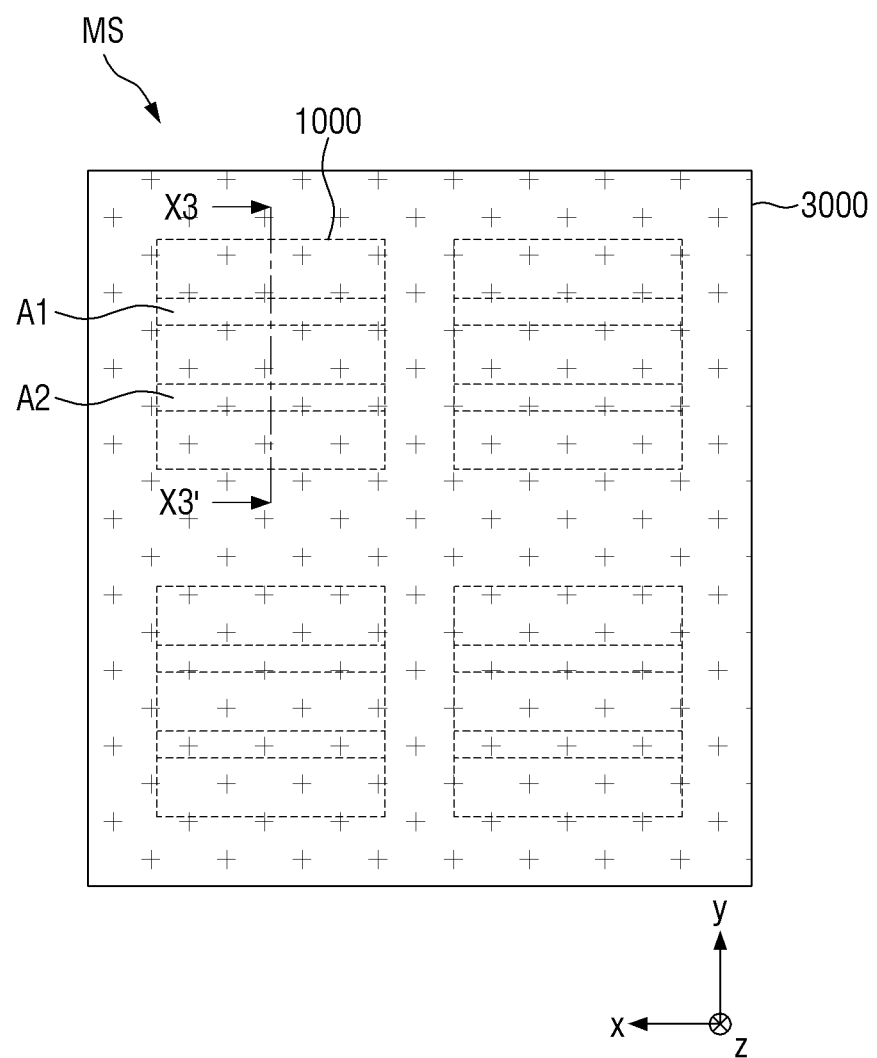
FIG. 23 is a rear view of the mother board of FIG. 22 according to some exemplary embodiments.

FIG. 22 is a perspective view of a mother board for a display device according to some exemplary embodiments. FIG. 23 is a rear view of the mother board of FIG. 22 according to some exemplary embodiments. FIGS. 24, 25, 26, and 27 are cross-sectional views taken along sectional line X3-X3' of FIG. 23 and illustrate a display device at various stages of manufacture according to some exemplary embodiments.

A method of fabricating a display device according to some exemplary embodiments will, hereinafter, be described with reference to FIGS. 22 through 27.

Referring to FIGS. 22 and 23, a mother board 2000 is formed, a resin layer 4000 is formed on the bottom surface of the mother board 2000, and a mother board structure MS is fabricated by coupling a support film 3000, which is yet to be cut into individual support films, and the resin layer 4000.

The mother board 2000 may include a plurality of display cells 1000 and a dummy area DD. The display cells 1000 may share the same board and may become individual display panels 100 later by being separated from the mother board 2000. That is, the cross-sectional stack structure of the display cells 1000 may be the same as the cross-sectional stack structure of the display panel 100 of FIG. 6 or 7. Each of the display cells 1000 may include first and second areas A1 and A2.

The dummy area DD may be disposed between the display cells 1000. The dummy area DD may be disposed near the display cells 1000 and may surround the display cells 1000. The dummy area DD may be an element that is removed, e.g., completely removed.

Figure 24:
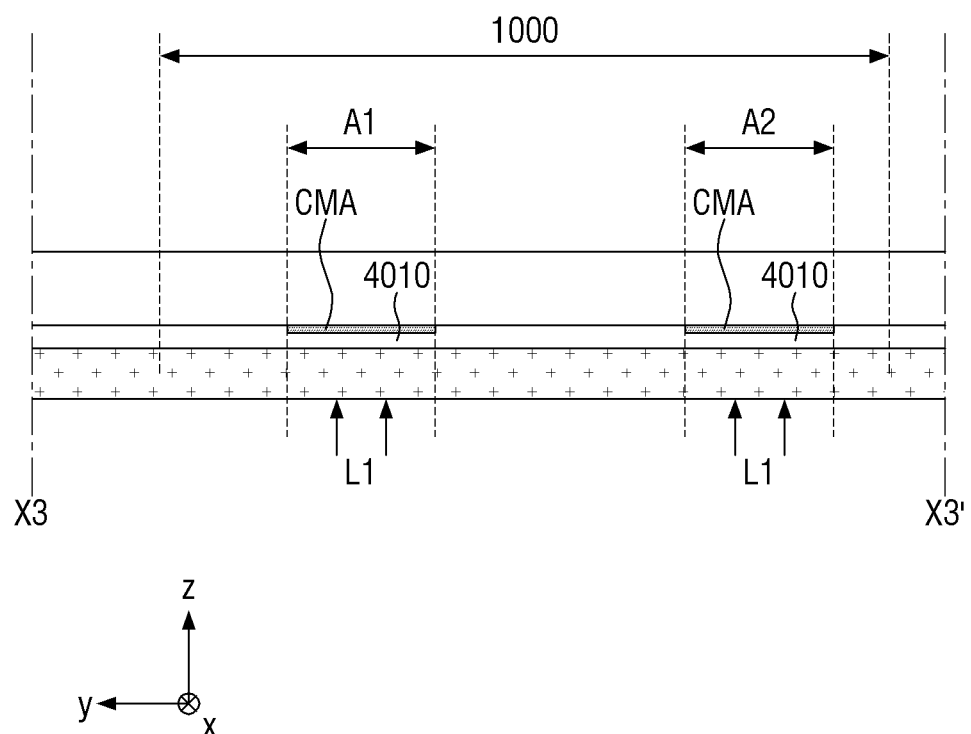
FIGS. 24, 25, 26, and 27 are cross-sectional views taken along sectional line X3-X3' of FIG. 23 and illustrate a display device at various stages of manufacture according to some exemplary embodiments.

Thereafter, referring to FIG. 24, laser light L1 is applied from below the support film 3000. The laser light L1 may be selectively applied to parts of the support film 3000 corresponding to the first and second areas A1 and A2 of each of the display cells 1000. In some exemplary embodiments, the laser light L1 may be ultraviolet (UV) laser light.

When the laser light L1 is applied, adhesion between the mother board 2000 and the resin layer 4000 may weaken in the first and second areas A1 and A2 of each of the display cells 1000. For instance, when the laser light L1 is applied to the first and second areas A1 and A2 of each of the display cells 1000, a carbide layer CMA may be formed on the bottom surface of the mother board 2000, the base substrate of the mother board 2000 may swell, or a carbide layer CMA may be formed in a first portion 4010 of the resin layer 4000 corresponding to the first area A1 and/or the second area A2 of each of the display cells 1000, and as a result, the adhesion between the first portion 4010 and the mother board 2000 may weaken. Although not specifically illustrated, the laser light L1 may be applied to parts of the dummy area DD where the extended lines of the first and second areas A1 and A2 of each of the display cells 1000 lie.

Figure 25:
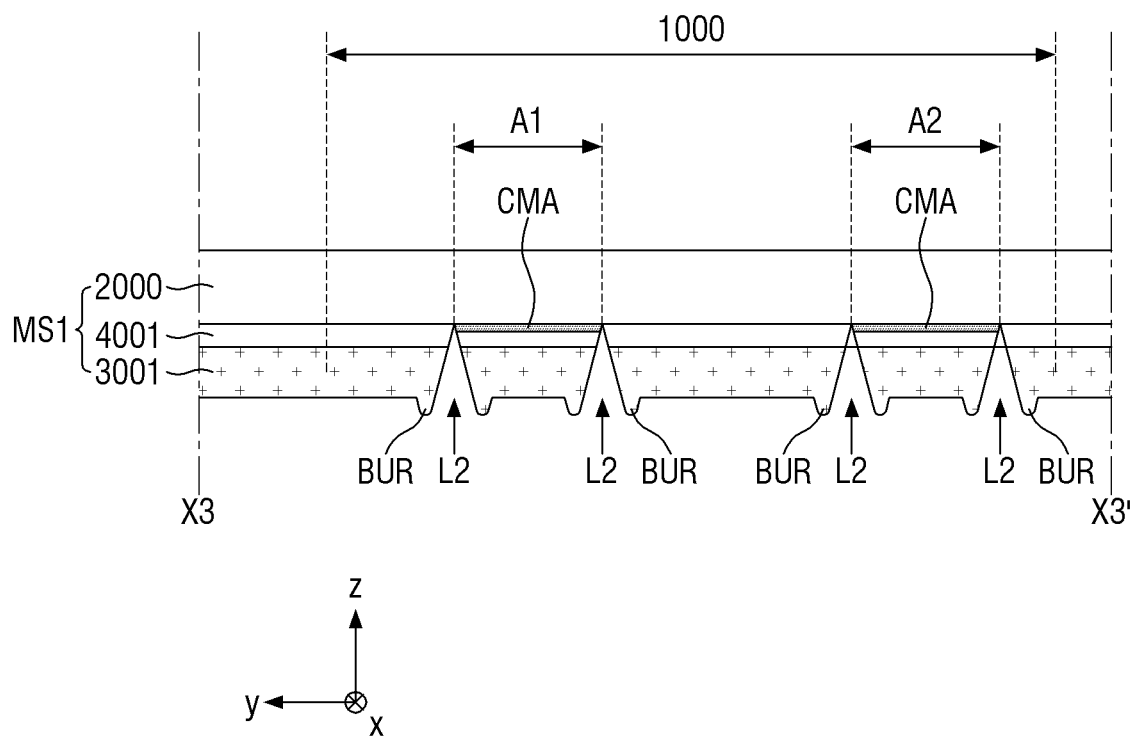

Thereafter, referring to FIG. 25, the resin layer 4000 and the support film 3000 may be cut by applying laser light L2 along the boundaries of each of the first and second areas A1 and A2 of each of the display cells 1000 from below the support film 3000. In this manner, a resin layer 4001 and a support film 3001 of a mother board structure MS1 may be formed. In some exemplary embodiments, the laser light L2 may be carbon dioxide ($CO_2$) laser light with a relatively high energy efficiency.

In the process of applying the laser light L2, burr patterns BUR may be formed on the bottom surface of the support film 3001. The burr patterns BUR may be formed along the boundaries of each of the first and second areas A1 and A2 of each of the display cells 1000. The burr patterns BUR may be formed by parts of the support film 3001 being melted by the thermal energy of the laser light L2. Although not specifically illustrated, the laser light L2 may also be applied to the boundaries of parts of the dummy area DD that lie on the extended lines of the first and second areas A1 and A2 of each of the display cells 1000.

Figure 26:
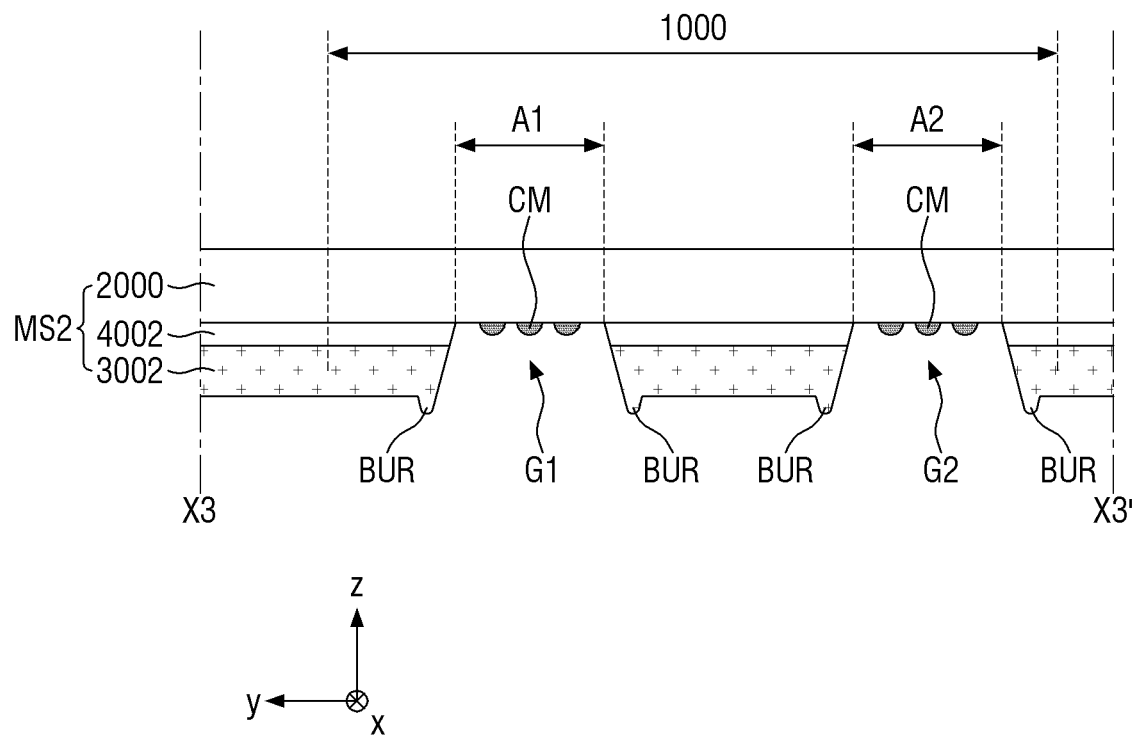

Thereafter, referring to FIG. 26, first grooves G1 and second grooves G2 are formed by removing parts of the support film 3001 that overlap with the first and second areas A1 and A2 of each of the display cells 1000. In this manner, a resin layer 4002 and a support film 3002 of a mother board structure MS2 may be formed. In some exemplary embodiments, the carbide layer CMA may partially remain unremoved, and thus, may be disposed in the first grooves G1 and the second grooves G2 as carbide CM. Although not specifically illustrated, parts of each of the resin layer 4002 and the support film 3002 corresponding to the parts of the dummy area DD that lie on the extended lines of the first and second areas A1 and A2 of each of the display cells 1000 may also be removed.

Figure 27:
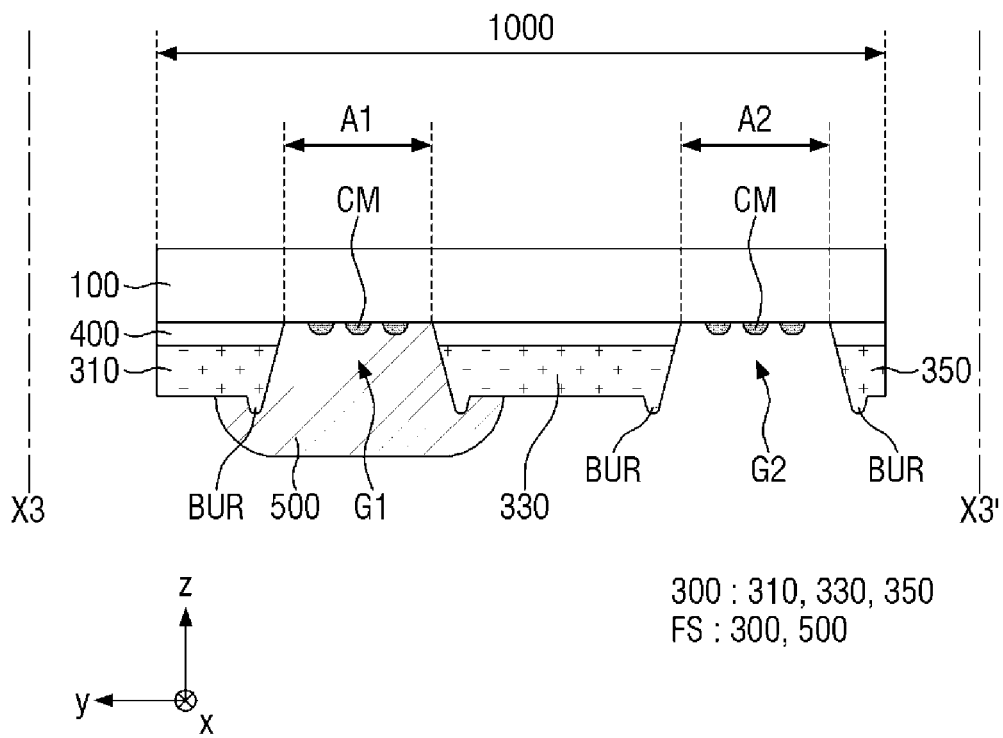

Thereafter, referring to FIG. 27, the display cells 1000 are separated by removing a part of the mother substrate structure MS2 corresponding to the dummy area DD. Each of the display cells 1000 may include a display panel 100, a resin layer 400, and a support film 300. Each of the display cells 1000 may further include a carbide CM. The support film 300 may include first and second film portions 310 and 330 separated by a first groove G1 of the support film 300, and a third film portion 350 separated from the second film portion 330 by a second groove G2 of the support film 300.

Thereafter, a support film structure FS for a display device is fabricated by forming a polymer layer 500 in the first groove G1 of the support film 300. The polymer layer 500 may be formed by filling the first groove G1 of the support film 300 with a polymer in the form of a solution or a paste and drying the polymer. Alternatively, although not specifically illustrated, the polymer layer 500 may be formed by attaching a polymer in the form of an adhesive tape on at least the inside of the first groove G1 of the support film 300. Still alternatively, the polymer layer 500 may be formed before the separation of the display cells 1000. That is, the polymer layer 500 may be formed in the first grooves G1 of the support film 3002, and then the display cells 1000 may be separated.

Thereafter, a flexible PCB FPC may be coupled to the display panel 100, and a neutral plane adjustment layer BPL may be formed to overlap with a second area A2 of the display panel 100, thereby forming the display device 1 of FIG. 1.

Thereafter, the display panel 100 may be bent, for instance, in a downward direction in the second area A2, thereby forming the display device 1 of FIG. 11.

As described in association with FIGS. 22 through 27, first grooves G1 and second grooves G2 are formed at the same time in the mother substrate structure MS2, and then, the display cells 1000 are separated. As such, fabrication of a display device can be simplified, but exemplary embodiments are not limited to simultaneous formation of the first and second grooves G1 and G2. Also, since the polymer layer 500 can be easily formed by applying a polymer solution, or attaching a polymer adhesive tape, on the inside of the first grooves G1, the fabrication of a display device can be further simplified. Although various effects of various exemplary embodiments have been described, the various effects are not limited by the foregoing, and other effects are anticipated.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a display panel comprising:
      a display area comprising a first area that is bendable; and
      a non-display area adjacent to the display area;
   a support film coupled to a bottom surface of the display panel, the support film comprising a first groove overlapping with the first area; and
   a polymer layer disposed in the first groove, the polymer layer comprising a material with higher flexibility than the support film,
   wherein angles formed by a top surface of the support film and inner sides of the support film defining the first groove are acute angles,
   wherein:
      the non-display area comprises a second area that is bendable; and the support film further comprises a second groove overlapping with the second area and extending in a same direction as the first groove.

2. The display device of claim 1, wherein the polymer layer fills the first groove and is in contact with the inner sides of the support film.

3. The display device of claim 2, wherein the polymer layer is further in contact with a bottom surface of the support film.

4. The display device of claim 2, further comprising:
a resin layer disposed between the display panel and the support film, the resin layer coupling the display panel and the support film,
wherein:
  the first groove is further defined in the resin layer; and
  the polymer layer is further in contact with inner sides of the resin layer defining the first groove.

5. The display device of claim 2, wherein:
a portion of the bottom surface of the display panel is exposed by the first groove; and
in the first groove, the polymer layer is further in contact with the portion of the bottom surface of the display panel.

6. The display device of claim 5, wherein:
the display panel comprises:
  a base substrate having flexibility, the base substrate comprising a bottom surface-providing the bottom surface of the display panel;
  a driving layer disposed on the base substrate;
  a light-emitting element disposed on the driving layer; and
  an inorganic layer covering the light-emitting element; and
in the first groove, the polymer layer is in contact with a portion of the bottom surface of the base substrate.

7. The display device of claim 1, wherein the polymer layer is formed as an adhesive tape.

8. The display device of claim 1, further comprising:
a carbide disposed between the bottom surface of the display panel and the polymer layer.

9. The display device of claim 8, wherein the carbide is in contact with the bottom surface of the display panel and the polymer layer.

10. The display device of claim 1, wherein:
the support film comprises polyethylene terephthalate (PET); and
the polymer layer comprises polyimide (PI).

11. The display device of claim 1, wherein a width of the first groove gradually increases with increasing distance from the display panel in a thickness direction.

12. The display device of claim 1, further comprising:
burr patterns disposed near the first groove and formed on a bottom surface of the support film,
wherein the burr patterns are in contact with the polymer layer.

13. The display device of claim 12, wherein the burr patterns and the polymer layer extend in the same direction.

14. The display device of claim 1, further comprising:
a carbide disposed on a portion of the bottom surface of the display panel exposed by the second groove.

15. The display device of claim 1, further comprising:
burr patterns disposed near the second groove and formed on a bottom surface of the support film.

16. The display device of claim 1, further comprising:
a neutral plane adjustment layer overlapping with the second area and comprising an organic material.

17. The display device of claim 16, further comprising:
a flexible printed circuit board connected to the display panel,
wherein the non-display area further comprises:
  a first non-display area comprising a first side adjacent to the display area; and
  a second non-display area disposed on a second side of the first non-display area opposing the first side, the second area being interposed between the first non-display area and the second non-display area, and
wherein, in the second non-display area, the flexible printed circuit board is connected to the display panel and is in contact with the neutral plane adjustment layer.

18. A display device comprising:
a display panel comprising:
  a display area comprising a first area that extends in a first direction, the first area being bendable; and
  a non-display area adjacent to the display area;
a flexible printed circuit board connected to the display panel;
a polymer layer disposed below the display panel, coupled to the display panel, and overlapping with the first area; and
a support film disposed below the display panel and coupled to the display panel, the support film comprising first and second film portions that are spaced apart from each other in a second direction with the polymer layer interposed therebetween, the second direction intersecting the first direction,
wherein a width, in the second direction, of the polymer layer increases with increasing distance from the display panel along a thickness direction crossing the first and second directions,
wherein the non-display area comprises:
  a first non-display area adjacent to the display area;
  a second non-display area more distant than the first non-display area from the display area, the second non-display area being connected to the flexible printed circuit board; and
  a second area disposed between the first and second non-display areas, the second area being bendable,
wherein the first film portion overlaps with a portion of the display area, and
wherein the second film portion overlaps with respective portions the display area and the first non-display area, the second film portion being spaced apart from the second area and the second non-display area when viewed in the thickness direction.

19. The display device of claim 18, wherein the polymer layer comprises a material with higher flexibility than the support film.

20. The display device of claim 18, wherein the polymer layer is in contact with each of the first and second film portions and the display panel.

21. The display device of claim 18, wherein:
a part of a bottom surface of the display panel is exposed between the first and second film portions; and
the exposed part of the bottom surface of the display panel comprises a portion having a first width in the second direction and a portion having a second width in the second direction, the second width being different from the first width.

22. The display device of claim 18, wherein the support film further comprises a third film portion spaced apart from the second film portion and overlapping with the second non-display area, the third film portion being spaced apart from the second area when viewed in the thickness direction.

* * * * *